(12) United States Patent
Miyashita

(10) Patent No.: US 7,627,179 B2
(45) Date of Patent: Dec. 1, 2009

(54) IMAGE PROCESSING APPARATUS, IMAGE PROCESSING METHOD, EXPOSURE APPARATUS, AND DEVICE MANUFACTURING METHOD

(75) Inventor: Tomoyuki Miyashita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 957 days.

(21) Appl. No.: 11/153,344

(22) Filed: Jun. 16, 2005

(65) Prior Publication Data
US 2005/0281454 A1 Dec. 22, 2005

(30) Foreign Application Priority Data
Jun. 18, 2004 (JP) .............................. 2004-181470

(51) Int. Cl.
*G06K 9/68* (2006.01)
*G06K 9/00* (2006.01)
(52) U.S. Cl. ....................................... 382/219; 382/141
(58) Field of Classification Search ................. 382/100, 382/103–104, 106, 141, 144–152, 190, 195, 382/209, 217–220
See application file for complete search history.

(56) References Cited

U.S. PATENT DOCUMENTS

| | | | | |
|---|---|---|---|---|
| 4,860,374 A | * | 8/1989 | Murakami et al. ........... | 382/151 |
| 5,554,983 A | * | 9/1996 | Kitamura et al. ............ | 340/937 |
| 5,768,483 A | | 6/1998 | Maniwa et al. .............. | 395/114 |
| 6,990,254 B2 | * | 1/2006 | Nahum ....................... | 382/278 |
| 7,039,238 B2 | * | 5/2006 | Sonmez et al. ............. | 382/219 |
| 2003/0026457 A1 | * | 2/2003 | Nahum ....................... | 382/106 |
| 2003/0026458 A1 | * | 2/2003 | Nahum ....................... | 382/106 |
| 2003/0130812 A1 | | 7/2003 | Haginiwa .................... | 702/94 |
| 2005/0074160 A1 | | 4/2005 | Miyashita ................... | 382/151 |
| 2005/0281454 A1 | | 12/2005 | Miyasyhita ................. | 382/145 |

FOREIGN PATENT DOCUMENTS

| | | |
|---|---|---|
| JP | 9-91102 | 4/1997 |
| JP | 2003-203846 | 7/2003 |

* cited by examiner

*Primary Examiner*—Manav Seth
(74) *Attorney, Agent, or Firm*—Fitzpatrick, Cella, Harper & Scinto

(57) ABSTRACT

An apparatus includes (a) an image processor which (i) calculates a similarity between first image data of a first partial region in object image data and reference image data, with respect to each pair of a second partial region of the first image data and a third partial region of the reference image data that correspond to each other, (ii) calculates a statistic of a plurality of the calculated similarities, with respect to a plurality of the image pairs, and (iii) recognizes, as a position of an object region in the object image data, a position of the first partial region in the object image data, which has the highest statistic of a plurality of the calculated statistics, and (b) an exposure unit which exposes a substrate to a pattern based on the position of the object region recognized by the image processor.

9 Claims, 29 Drawing Sheets

DISTRIBUTION OF SIMILARITY

F I G. 13
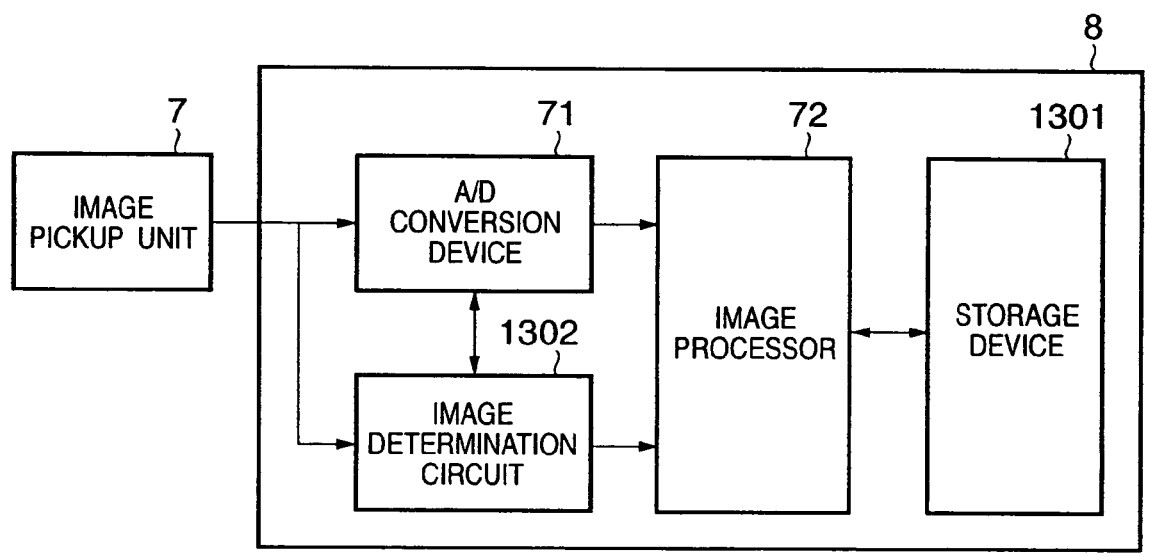

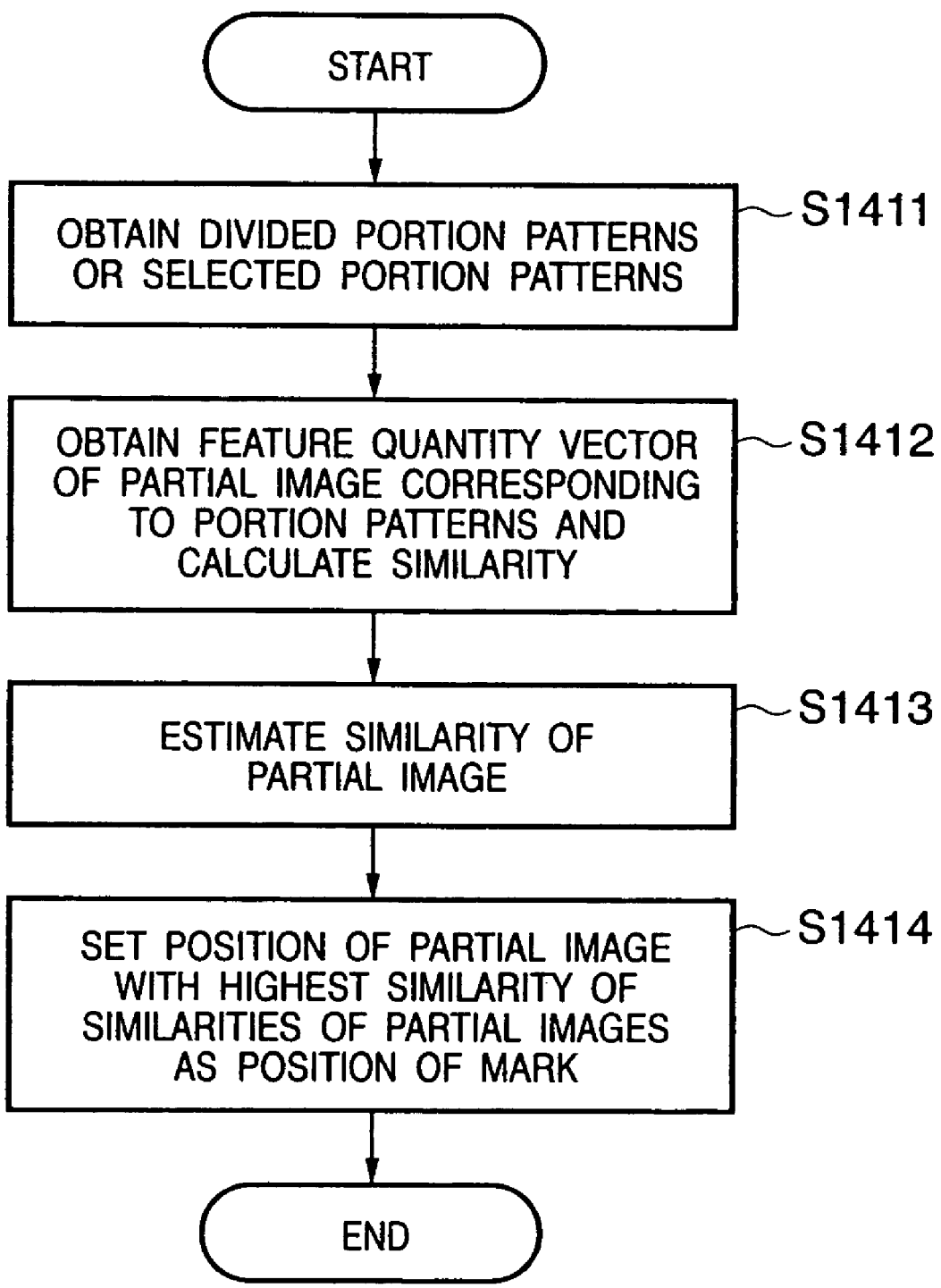

FIG. 15A

| PARTIAL IMAGE | DIVIDED PORTION OR SELECTED PORTION | | | | | ESTIMATE OF SIMILARITY OF PARTIAL IMAGE |
|---|---|---|---|---|---|---|
| | SIMILARITY OF PARTIAL REGION | | | | | |
| 1 | a1 | b1 | c1 | ... | n1 | 0.6 |
| | 1 | 0 | 1 | ... | 1 | |
| 2 | a2 | b2 | c2 | ... | n2 | 0.8 |
| | 1 | 1 | 0 | ... | 1 | |
| ... | ... | ... | ... | ... | ... | |
| N | aN | bN | cN | ... | nN | 0.7 |
| | 1 | 0 | 1 | ... | 0 | |

FIG. 18

| | MARK IMAGE | | | | | | | | AVERAGED TEMPLATE | |
|---|---|---|---|---|---|---|---|---|---|---|
| | 1 | | 2 | | ... | N | | | | |
| FEATURE REGION | FEATURE QUANTITY VECTOR | FEATURE REGION | FEATURE QUANTITY VECTOR | ... | ... | FEATURE REGION | FEATURE QUANTITY VECTOR | | FEATURE REGION | FEATURE QUANTITY VECTOR |
| 2 | a1 | 2 | b1 | ... | ... | 2 | n1 | | 2 | λ1 |
| 3 | a2 | 3 | b2 | ... | ... | 3 | n2 | | 3 | λ2 |
| ... | ... | ... | ... | ... | ... | ... | ... | | ... | ... |
| m1 | am1 | m2 | bm2 | ... | ... | mN | nmN | | ms | λms |

SEMICONDUCTOR DEVICE MANUFACTURING FLOW

IMAGE PROCESSING APPARATUS, IMAGE PROCESSING METHOD, EXPOSURE APPARATUS, AND DEVICE MANUFACTURING METHOD

This application claims priority from Japanese Patent Application No. 2004-181470, filed on Jun. 18, 2004, the entire contents of which are hereby incorporated by reference herein.

FIELD OF THE INVENTION

The present invention relates to an image processing technique for obtaining the position of an object region in object image data.

BACKGROUND OF THE INVENTION

Before projecting a reticle pattern onto a wafer to perform exposure, a semiconductor manufacturing apparatus, such as an exposure apparatus, performs alignment of the wafer with the reticle. To perform the alignment, the semiconductor manufacturing apparatus generally captures a digital image (to be referred to as an "observed image" hereafter) with an alignment mark (to be simply referred to as a "mark" hereafter) on the wafer in the center of the image, using an image input apparatus, such as a CCD camera, and detects the position of the mark from the observed image using a pattern recognition technique. The procedure for detecting the position of the mark is divided into two steps: narrowing down the rough position of the alignment mark from the entire observed image (the first step: this processing step will also be referred to as "pre-alignment" hereafter); and detecting the precise position of the alignment mark at and around the narrowed position (the second step).

In the pre-alignment, the position of the mark is detected by the pattern recognition technique. More specifically, evaluation values are calculated at respective observation positions in the observed image, and one with the highest evaluation value is detected as the position of the mark. In this case, for example, the similarity is evaluated between the feature quantity vector of a template image serving as a reference for detecting the position of the alignment mark and that of an image (to be referred to as a "partial image") in an observed image obtained by picking up an image of the position of the alignment mark on the wafer and its vicinity, and the pattern of the mark to be recognized is detected on the basis of a partial image with the highest similarity.

If the position of a mark is detected using the above-described technique for pattern recognition in the conventional art (to be referred to as "template image-based recognition" hereafter), degradation in image quality of an observed image to be compared causes a decrease in precision in detecting the feature quantity vector of a partial image, thus resulting in a large decrease in detection rate based on similarity evaluation. In a semiconductor manufacturing apparatus, a change in conditions for a semiconductor manufacturing process, a change in illumination conditions for illuminating a reticle, or the like, may cause the following: (1) a local change in lightness (the degree of brightness) of a mark portion in the observed image; and (2) a local defect in the mark portion in the observed image (e.g., the observed image is partially lost and becomes unfit to undergo similarity evaluation). The phenomena (1) and (2) will be referred to as "local degradation" hereafter. Such local degradation in the conventional art becomes a major factor for a decrease in the detection rate based on similarity evaluation.

An example of a decrease in the detection rate caused by local degradation will be shown below. FIG. 11A shows image T (also to be referred to as a template image or a mark image) to be recognized; FIG. 11B, image B whose lightness has changed in four corners; and FIG. 11C, image C whose four corners are lost.

In FIGS. 11A to 11C, if a pixel value is used as a feature quantity, a process of setting the pixel values of pixels as elements of a feature quantity vector is performed in tandem with scanning each row of pixels, as shown in FIG. 12. FIG. 12 is a view for explaining a step of setting the pixel values of pixels as elements of a feature quantity vector by taking image T of FIG. 11A as an example. First, let a1, b1, a4, and b4 be contours of image T of FIG. 11A. Scanning is performed, pixel by pixel, from a pixel corresponding to a1 at the upper left of image T to the right (the scanning line is denoted by reference numeral 1201). When scanning is performed up to the right end b1, the row to be scanned is moved down by one pixel, and scanning is performed, pixel by pixel, from a pixel corresponding to a left end a2 in a row immediately below the first row to b2 in a direction indicated by scanning line 1202. This operation is sequentially repeated. More specifically, scanning is repeated to a pixel at the right end b4 along a scanning line 1204 in the bottom row. In scanning, the pixel value of each pixel is set as an element of a feature quantity vector.

The pixel value can be set to fall within a dynamic range from 0 to 255. Assume that the pixel value of each pixel in a white portion denoted by reference numeral 1 is 255; that of each pixel in a black portion denoted by reference numeral 2, 0; and that of a gray portion with a tone, halfway between white and black, denoted by reference numeral 3, 128.

For the sake of simplicity, assume that the total number of pixels of each of the images (FIGS. 11A to 11C) is 100; the number of white pixels (pixel value: 255) of image T in FIG. 11A is 50; and the number of black pixels (pixel value: 0) is 50. Also assume that the number of white pixels (pixel value: 255) of image B in FIG. 11B is 35; and the number of black pixels (pixel value: 0) is 65. Further, assume that the number of white pixels (pixel value: 255) of image C in FIG. 11C is 35; the number of black pixels (pixel value: 0) is 35; and the number of gray pixels (pixel value: 128) is 30.

Using the normalized correlation between an image (template image) to be recognized and a partial image in an observed image, the similarity can be given by the following formula (1):

$$\text{Similarity} = \langle (D-\mu D)\cdot(H-\mu H)\rangle / (|D-\mu D|\cdot|H-\mu H|) \quad (1)$$

D: the pattern of a template image;
H: the pattern of a partial image:
μD: the average of elements of the feature quantity vector in the template image; and
μH: the average of elements of the feature quantity vector in the partial image.

In accordance with formula (1), the similarity between image T and image B, and that between image T and image C, are obtained on the basis of the one hundred-dimensional feature quantity vectors of the images, each of whose total number of pixels is 100. The results are as follows:

(1) Similarity between Image T and Image B: 0.734; and
(2) Similarity between Image T and Image C: 0.837.

In the above example, the similarities are obtained on the basis of the one-hundred-dimensional feature quantity vectors, each corresponding to one hundred pixels. A further simplified example, i.e., a case wherein the total number of pixels is five will be explained below. Assume that the feature quantity vector of a template image to be recognized is given as a five-dimensional vector [1, 1, 0, 1, 1]. If the feature quantity vector of a partial image containing a mark portion changes from [1, 1, 0, 1, 1,] to [1, 1, 0, 0, 1] due to local degradation (the feature quantity of the fourth pixel from the left degrades from "1" to "0"), the similarity obtained by formula (1) decreases to 0.61 (in the absence of local degradation, the similarity does not change and remains 1.0).

As shown in the above example, in the evaluation of similarity using the normalized correlation between a template image and a partial image, the similarity largely decreases due to local degradation in the image, thus resulting in a decrease in the precision in detecting the position of a mark in pre-alignment. Examples of a template-based recognition technique include one shown in Japanese Patent Laid-Open No. 2003-203846.

However, in template-based recognition in the conventional art, the similarity in mark portion largely decreases due to local degradation in image data. As a result, if a partial image containing a mark portion to be recognized has a lower similarity than that of a portion except for the mark portion, misrecognition occurs in the position of a mark to be recognized.

In a semiconductor exposure apparatus, when the apparatus stops due to misrecognition of a mark position, an alignment process needs to be retried, to correct the misrecognition, and the availability of the apparatus decreases.

The present invention has as its exemplified object to provide an image processing technique, which suppresses misrecognition of an object region in object image data.

SUMMARY OF THE INVENTION

To attain the above-described object, an image processing apparatus and an image processing method according to the present invention mainly comprise the following configurations.

More specifically, an apparatus according to the present invention comprises:

a first calculation unit to calculate a similarity between first image data of a first partial region in object image data, and reference image data with respect to each pair of a second partial region of the first image data and a third partial region of the reference image data corresponding to each other;

a second calculation unit to calculate a statistic of a plurality of similarities calculated by the first calculation unit with respect to a plurality of the image pairs; and a recognition unit to recognize, as a position of an object region in the object image data, a position of the first partial region in the object image data, which has the highest statistic of a plurality of the statistic calculated by the second calculation unit.

Moreover, a method according to the present invention comprises steps of:

calculating a similarity between first image data of a first partial region in object image data and reference image data with respect to each pair of a second partial region of the first image data and a third partial region of the reference image data corresponding to each other;

calculating a statistic of a plurality of similarities calculated in the step of calculating the similarity with respect to a plurality of the image pairs; and recognizing, as a position of an object region in the object image data, a position of the first partial region in the object image data, which has the highest statistic of a plurality of the statistic calculated in the step of calculating the statistic.

Moreover, an exposure apparatus according to the present invention comprises the apparatus discussed above.

Moreover, a device manufacturing method according to the present invention comprises steps of:

exposing a substrate to a pattern using the exposure apparatus;

developing the exposed substrate; and processing the developed substrate to manufacture the device.

BRIEF DESCRIPTION OF THE DRAWINGS

FIG. 13 is a block diagram showing the arrangement of the pre-alignment image processing apparatus 8;

FIG. 14 is a flowchart for schematically explaining the flow of a position detection process;

FIG. 15A is a chart showing the relationship between a partial image, the similarities of partial regions in the partial image and the estimate of similarity of the partial image, and examples of arithmetic operation results;

FIG. 18 is a chart showing a state wherein selection regions of a plurality of mark images, the feature quantity vectors for the selected regions, and an averaged template image based on the obtained feature quantity vectors to be stored in a storage device are stored in the storage device;

DETAILED DESCRIPTION OF THE PREFERRED EMBODIMENTS

Figure 1A:
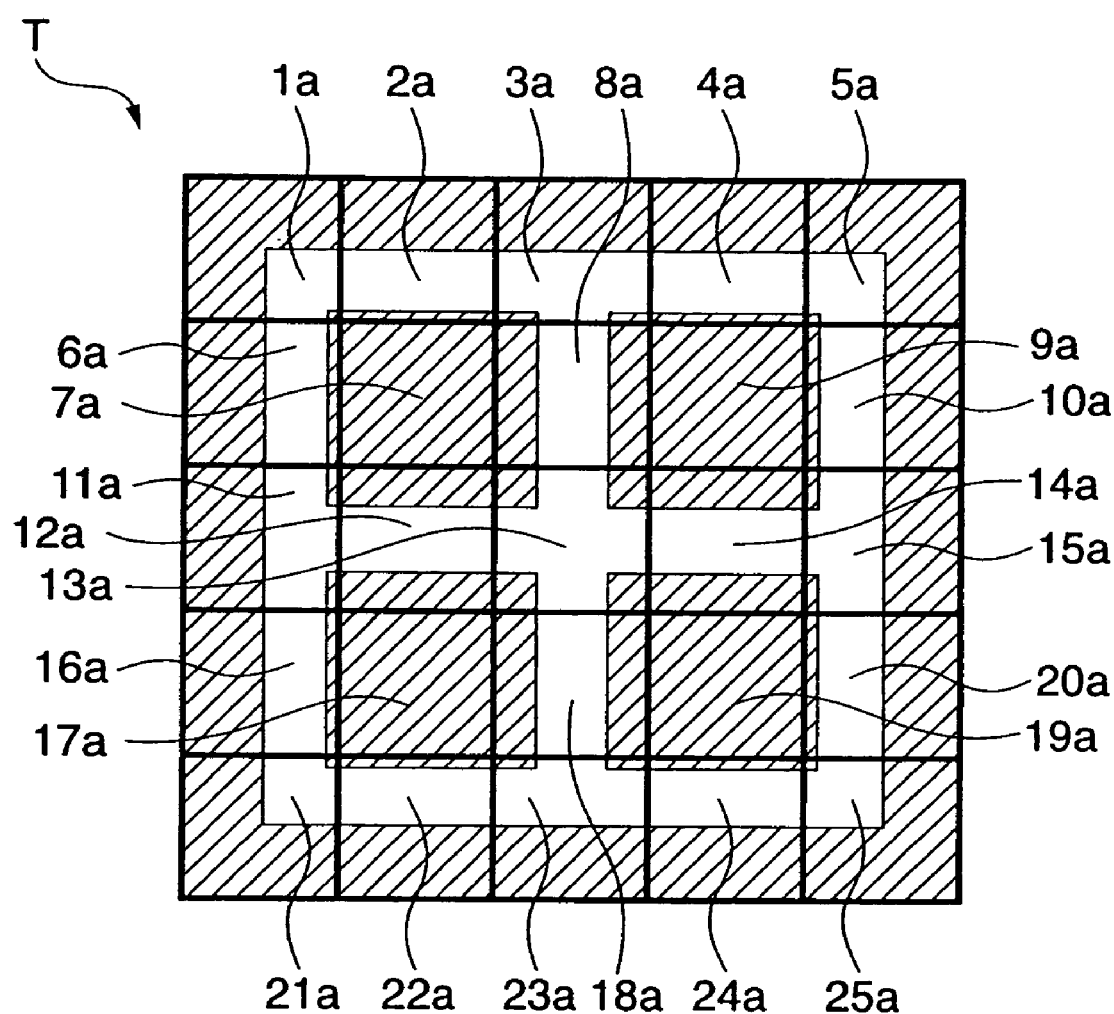
FIG. 1A is a view showing an example wherein a template image T is divided into twenty-five regions.

Preferred embodiments of the present invention will be explained below with reference to the drawings.

First Embodiment

FIG. 13 is a block diagram showing the arrangement of a pre-alignment image processing apparatus 8. The pre-alignment image processing apparatus 8 causes an A/D conversion device 71 to convert, into digital information, a video signal obtained by photoelectric conversion in an image pickup unit 7, such as a CCD or a contact image sensor, and causes an image processor 72 to perform a pre-alignment process. A template image and its digital information, and parameters that pertain to the coordinate values of regions involved in division or selection, a feature quantity type, and the order of feature quantity vectorization for performing pre-alignment, are stored in advance in a storage device 1301. The image processor 72 performs the pre-alignment process on the basis of digital information based on an observed image of an alignment mark and its vicinity picked up by the image pickup unit 7 and the digital information based on the template image stored in the storage device 1301. Reference numeral 1302 denotes an image determination circuit, which can determine the distribution of lightness, the defect state, and the like, of an image picked up by the image pickup unit 7. The image processor 72 can divide or select a template image in a manner suitable for similarity evaluation using, e.g., a determination result from the image determination circuit 1302. In this case, on the basis of the determination result from the image determination circuit 1302, the image processor determines a suitable divided or selected pattern using a plurality of parameters stored in the storage device 1301.

In this embodiment, the image processor 72 has the initiative in performing the pre-alignment process (also to be referred to as a "position detection process" hereafter). The position detection process to be performed by the image processor 72 has as its object to solve a problem of a decrease in similarity caused by local degradation in an observed image, as explained in the conventional art. The image processor 72 divides a template image into a plurality of divided portions (regions) or arbitrarily selects selected portions (regions) from the template image, and evaluates the similarity (matching ratio) of each of regions (partial regions) of a partial image in an observed image corresponding to these regions. The image processor 72 estimates the value obtained by statistically processing the similarities of the partial regions to be the similarity of the entire partial image.

Figure 15B:
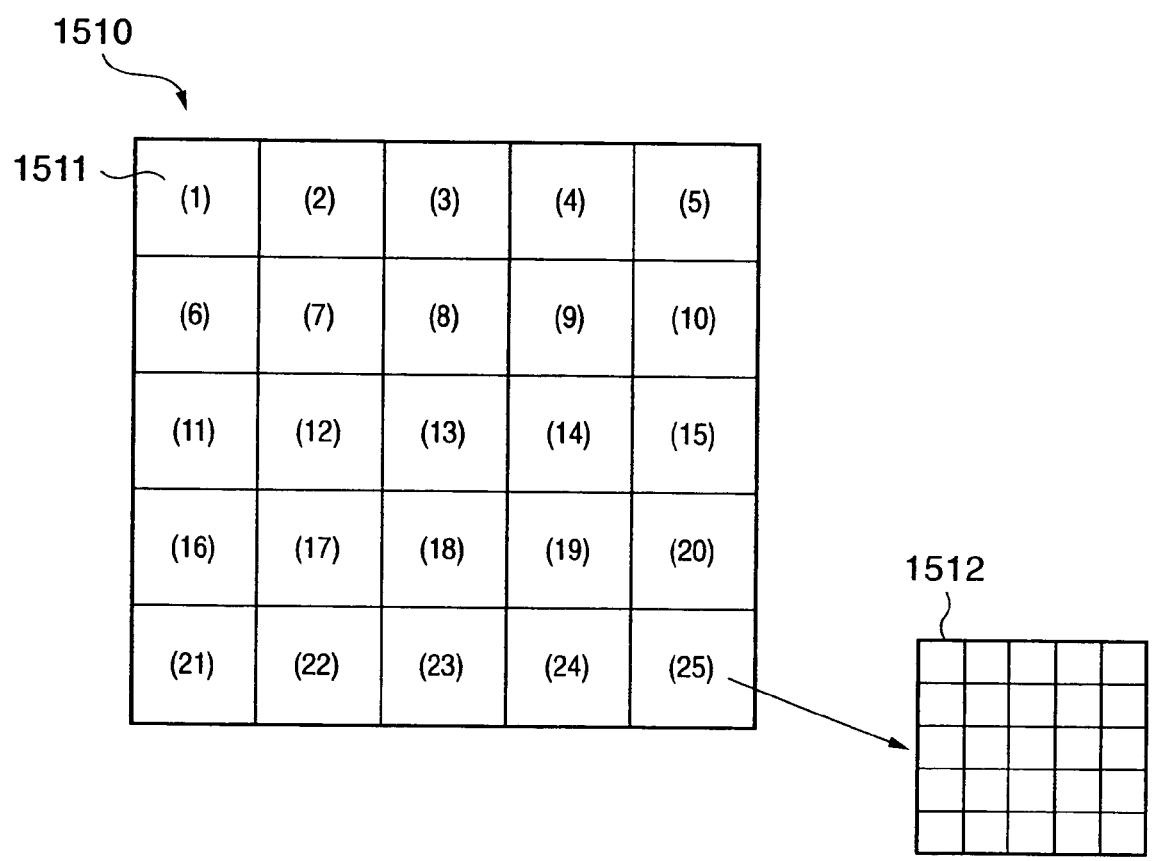
FIG. 15B is a view illustrating the relationship between an observed image, partial images, and partial regions obtained by dividing each of the partial images.

FIG. 15B is a view illustrating the relationship between an observed image 1510 obtained by observing an alignment mark on a wafer (substrate) and its vicinity using the image pickup unit 7, partial images 1511, and partial regions 1512, obtained by dividing each of the partial images 1511. FIG. 15A is a chart showing the relationship between a partial image 1501 ((1), (2), . . . , (N)), similarities (1502 and 1503) of partial regions in the partial image, an estimate 1504 of a similarity of the partial image, and examples of arithmetic operation results. The image processor 72 obtains the similarities (1503) of partial regions corresponding to a template image (an image serving as a reference for determining a partial image containing an alignment mark from the observed image) for each of the partial images ((1), (2), . . . , (N)) and statistically processes the similarities of the partial region, thereby estimating the similarities of the partial images. The image processor 72 narrows down a partial image containing the alignment mark (also to be referred to as "the position of the alignment mark" hereafter) to a partial image (the partial image (2) in the case of FIG. 15B) with the highest estimate of similarity (determines the partial image with the highest estimate as the partial image containing the alignment mark).

The details and effects of the position detection process to be performed by the image processor 72 will be explained more specifically. FIG. 14 is a flowchart for schematically explaining the flow of the position detection process.

First, in step S1411, divided portion patterns or selected portion patterns are obtained. The image processor 72 selects a template image stored in the storage device 1301 and divides the selected template image into, e.g., n×m (n, m: natural numbers) regions (see, e.g., FIG. 1A). The image processor 72 obtains a feature quantity vector to generate a vectorized pattern for each of the divided regions (to be referred to as a "divided portion pattern" hereafter). The image processor 72 can use, as a feature quantity in vectorization, the pixel value (0 to 255) of each of pixels constituting each divided region, information on an edge (edge position and edge degree) specified by a change in gray-scale image (change in pixel value), or the like.

Figure 12:
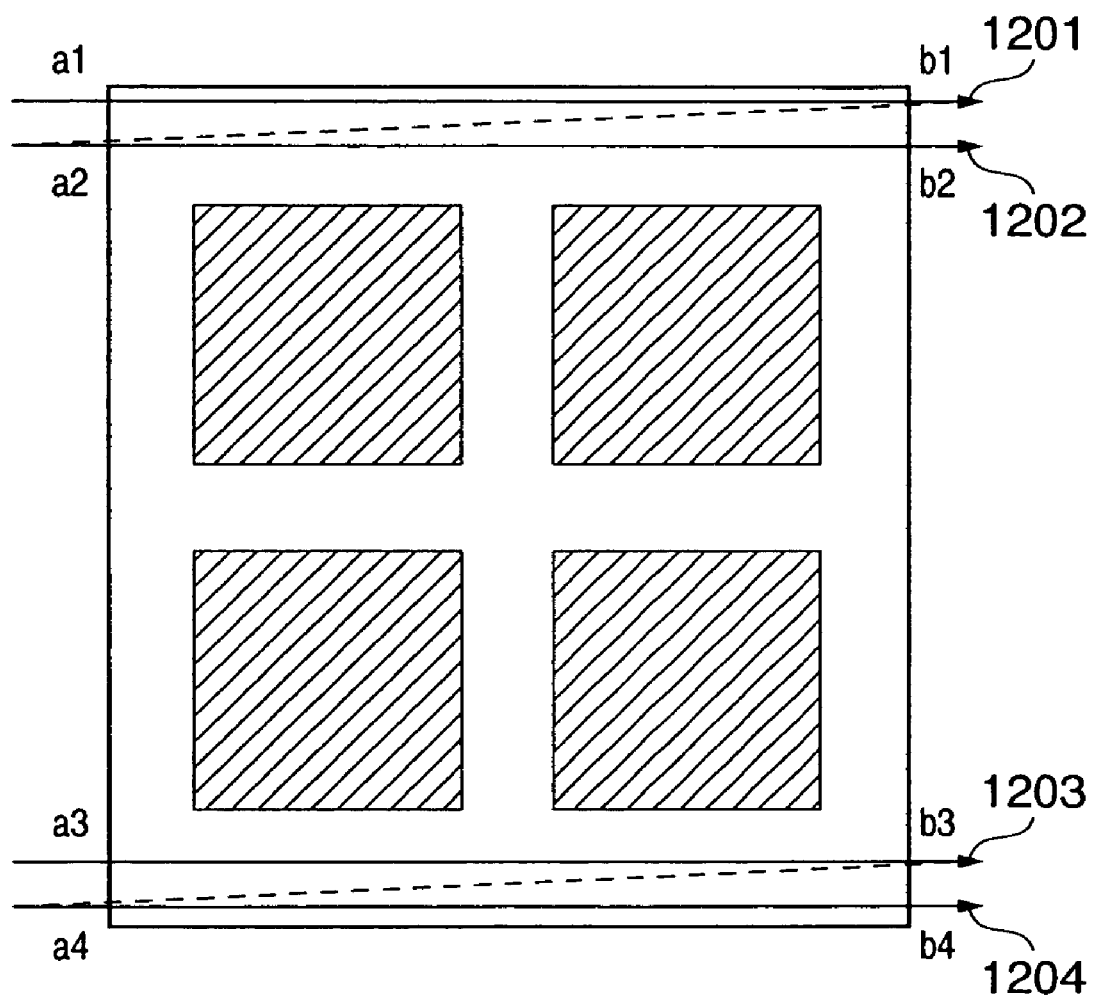
FIG. 12 is a view for explaining a step of setting the pixel value of each pixel as an element of a feature quantity vector by taking the image T of FIG. 11A as an example.

FIG. 1A is a view showing an example wherein a template image T is divided into twenty-five regions. To obtain feature quantities of each of the divided regions using, e.g., pixel values, the image processor 72 sets the pixel value of each pixel as an element of a feature quantity vector while scanning the pixel, as explained with reference to FIG. 12. The image processor 72 obtains the feature quantity vectors of all of the divided regions (1a to 25a), and stores the results in the storage device 1301, such that they can be looked up in a statistical process (to be described later) (step S1412). Note that vectorization can be arbitrarily controlled by the image processor 72 on the basis of a parameter that pertains to the order of feature quantity vectorization stored in the storage device 1301, and the scanning direction and the number of pixels to be scanned for obtaining pixel values. The present invention is not limited to the scanning order, as shown in FIG. 12.

Alternatively, the image processor 72 can select a plurality of sets of pixels at arbitrary positions of the template image T and can calculate the feature quantities of each selected set of pixels to generate a vectorized pattern (to be referred to as a "selected portion pattern" hereafter) for the selected set of pixels, instead of a divided portion pattern. In the generation process, the image processor 72 can use, as a feature quantity in vectorization, the pixel value (0 to 255) of each pixel or information on an edge specified by a change in a gray-scale image (change in pixel value) in each of the selected sets of pixels, similarly to the divided portion patterns.

Figure 1B:
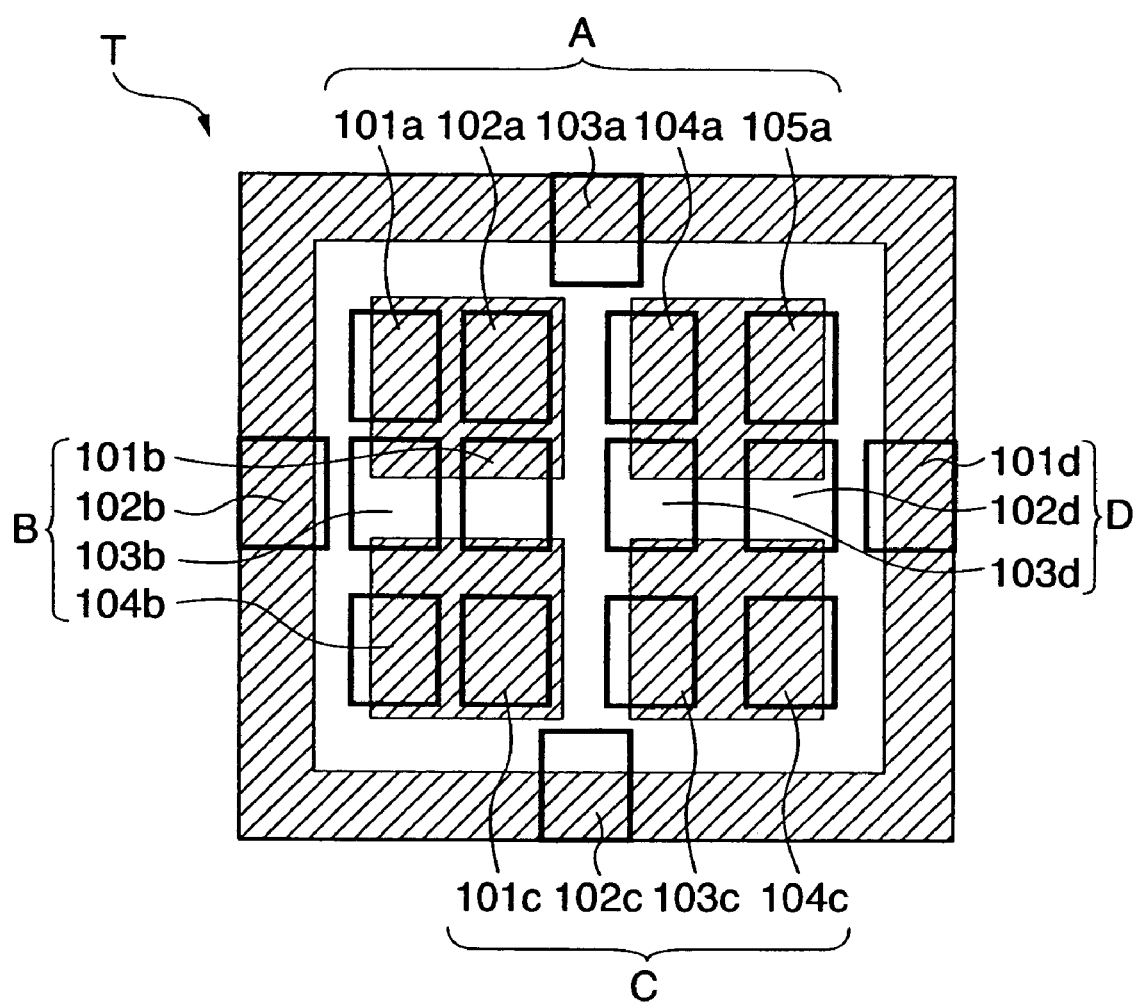
FIG. 1B is a view illustrating four regions (A, B, C, and D), which an image processor 72 selects to obtain the feature quantity vectors of selected portion patterns in the template image T.

FIG. 1B is a view illustrating four regions (A, B, C, and D), which the image processor 72 selects, to obtain the feature quantity vectors of the selected portion patterns in the template image T. In FIG. 1B, pixels selected by the image processor 72 are enclosed in square regions. The selected portion A is composed of five selected regions (101a to 105a), and the selected portions B and C are composed of four selected regions (101b to 1014b and 101c to 104c), respectively. The selected portion D is composed of three selected regions (101d to 103d). The image processor 72 calculates the feature quantity vectors of the selected portions (A, B, C, and D) for each of the square regions. For example, assume that a pixel value is used as a feature quantity. As for the selected portion A, the image processor 72 sets the pixel value of each pixel as an element of a feature quantity vector while scanning the pixel, as explained with reference to FIG. 12, for each of the five selected regions (101a to 105a). The same applies to the selected regions B to D. The image processor 72 sets a feature quantity vector for each of the selected regions and stores the result in the storage device 1301, such that it can be looked up in the statistical process (to be described later) (step S1412).

The image processor 72 generates divided portion patterns (FIG. 1A) or selected portion patterns (FIG. 1B) as "portion patterns" of a template image, serving as a recognition reference in the process in step S1411. In this embodiment, the image processor 72 obtains the divided portion patterns (FIG. 1A) by dividing the template image into 5×5 regions. However, a unit of division is not limited to this. The image processor 72 can arbitrarily set the number of divisions in accordance with parameters that pertain to the coordinate values of regions involved in division or selection, a feature quantity type and the order of feature quantity vectorization stored in the storage device 1301, the size of, the lightness of and the presence/absence of a defect in an observed image input to the pre-alignment image processing apparatus 8, and the like. The unit of division may be designated by the operation of the operator. In this embodiment, the image processor 72 selects the four regions A, B, C, and D in the template image to obtain the selected portion patterns (FIG. 1B). In the selection of regions as well, the unit of division can be designated in accordance with the parameters stored in the storage device 1301, and the size of, the lightness of and the presence/absence of a defect in the observed image input to the pre-alignment image processing apparatus 8, or by the operation of the operator.

Referring back to FIG. 14, in step S1412, the image processor 72 vectorizes the feature quantities of a partial image corresponding to the portion patterns (the portion patterns of the template image) obtained in the process in step S1411, in the same manner as the calculation of the feature quantity vectors in step S1411, and calculates the similarity between each portion pattern of the template image and a corresponding pattern of the partial image. The similarities of partial regions are obtained for each of divided regions or selected regions of the template image.

The flow advances to step S1413. The image processor 72 performs the statistical process using the similarities of the plurality of partial regions calculated in step S1412 and sets the result as the similarity of the partial image (to be referred to as an "estimate of similarity" hereafter).

In the estimation of the similarity of the partial image, the image processor 72 creates a histogram, in which the similarities 1503 of the partial regions are used as samples and calculates, from the histogram, an average, a median, the average of the samples, except for the top 25% and bottom 25%, the median of the samples, except for the top 25% and bottom 25%, or the like. The image processor 72 sets the value obtained by the statistical process as the similarity of the partial image ((i): i=1, 2, . . . , N). The image processor 72 stores the result of the statistical process in a table in the storage device 1301, which can be looked up.

Figure 1C:
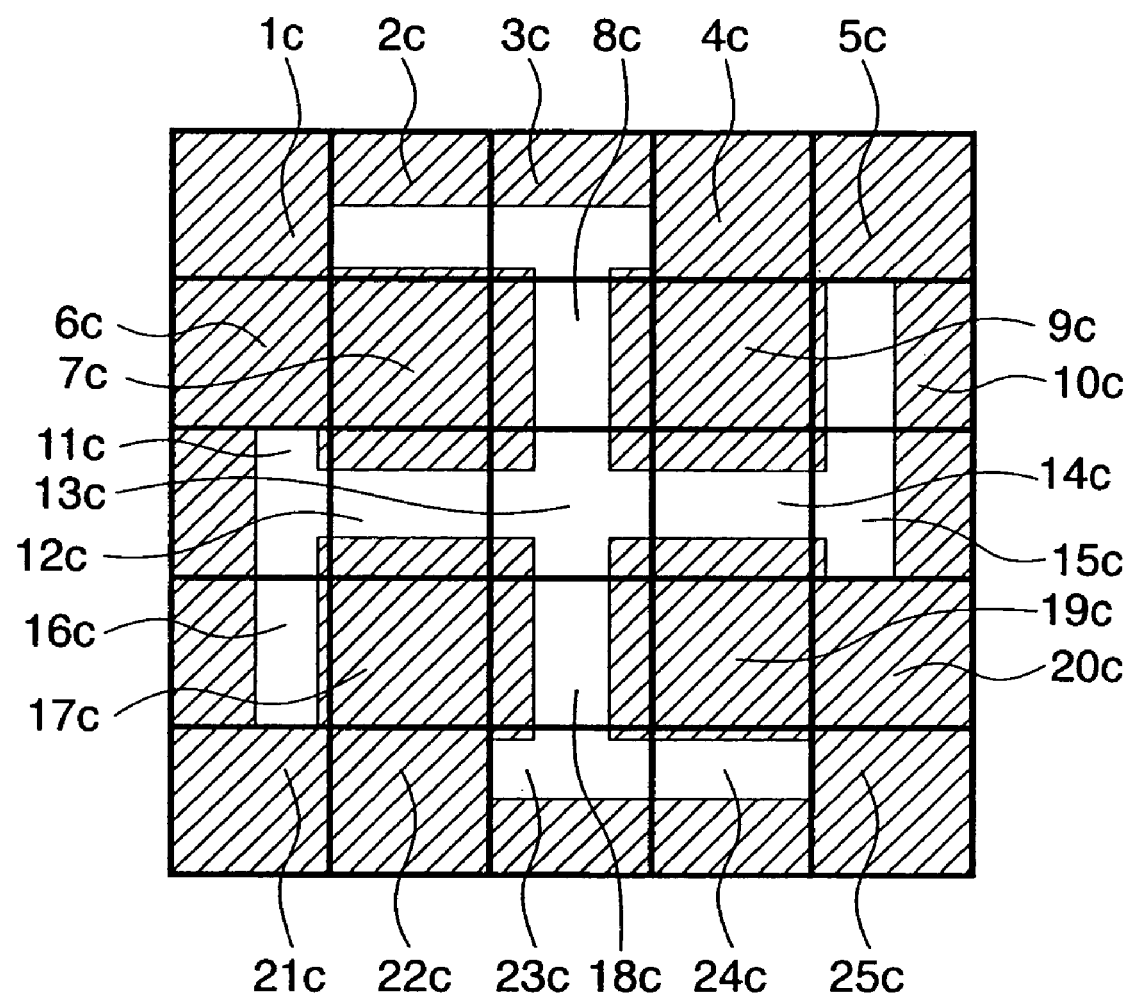
FIG. 1C is a view illustrating, as a partial image, a mark image having suffered local degradation.

FIG. 1C is a view illustrating, as partial images, a mark image having suffered local degradation. Divided regions 1c to 25c are ones corresponding to the divided regions 1a to 25a in FIG. 1A. The image processor 72 calculates the similarities of the corresponding divided regions, creates a histogram (FIG. 1D) on the basis of the twenty-five calculated similarities, and performs the statistical process. In the case of selected portion patterns, the image processor 72 obtains the similarity of a partial image in an observed image corresponding to each of selected regions in the template image T, creates a histogram, and performs the statistical process in the same manner.

Figure 1D:
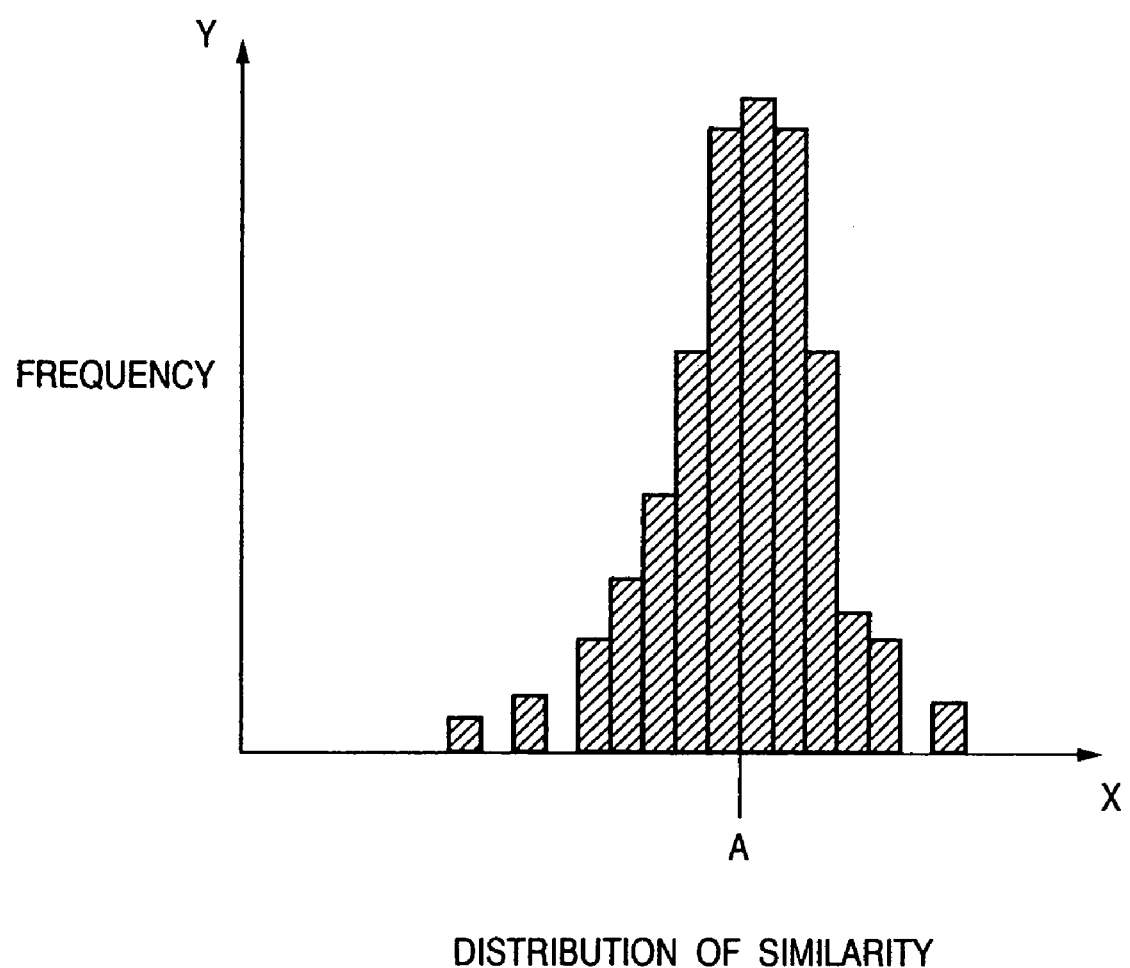
FIG. 1D is a graph showing a histogram in which similarities are used as samples.

The histogram in FIG. 1D is one obtained when only divided portion patterns are considered, in the case of FIG. 1C. In FIG. 1D, the abscissa X is an axis indicating the distribution of similarity, while the ordinate Y indicates the axis of frequency. In FIG. 1D, the image processor 72 estimates a median A to be the similarity of the partial image.

In step S1414, the image processor 72 sets, as the position of a mark, the position of a partial image with the highest similarity of the similarities of estimated partial images.

In the method explained with reference to FIG. 14, a plurality of partial regions are extracted and used from a template image. Alternatively, a plurality of partial templates, each composed of a set of the positional information and feature quantity of a point of interest in the template image, may be prepared, and the similarity between each partial template and a corresponding partial image of an observed image may be obtained on the basis of the positional information and feature quantity of the point of interest. The similarity between the partial image and the template image can be obtained from the similarities of the plurality of partial templates in the above-described manner.

The histogram in FIG. 1D is one obtained when only divided portion patterns are considered, in the case of FIG. 1C. In FIG. 1D, the abscissa X is an axis indicating the distribution of similarity, while the ordinate Y indicates the axis of frequency. In FIG. 1D, the image processor 72 estimates a median A to be the similarity of the partial image.

In step S1414, the image processor 72 sets, as the position of a mark, the position of a partial image with the highest similarity of the similarities of estimated partial images.

In the method explained with reference to FIG. 14, a plurality of partial regions are extracted and used from a template image. Alternatively, a plurality of partial templates, each composed of a set of the positional information and feature quantity of a point of interest in the template image, may be prepared, and the similarity between each partial template and a corresponding partial image of an observed image may be obtained on the basis of the positional information and the feature quantity of the point of interest. The similarity between the partial image and the template image can be obtained from the similarities of the plurality of partial templates in the above-described manner.

[Concrete Effects]

[When Divided Portion Patterns are Used]

Figure 3:
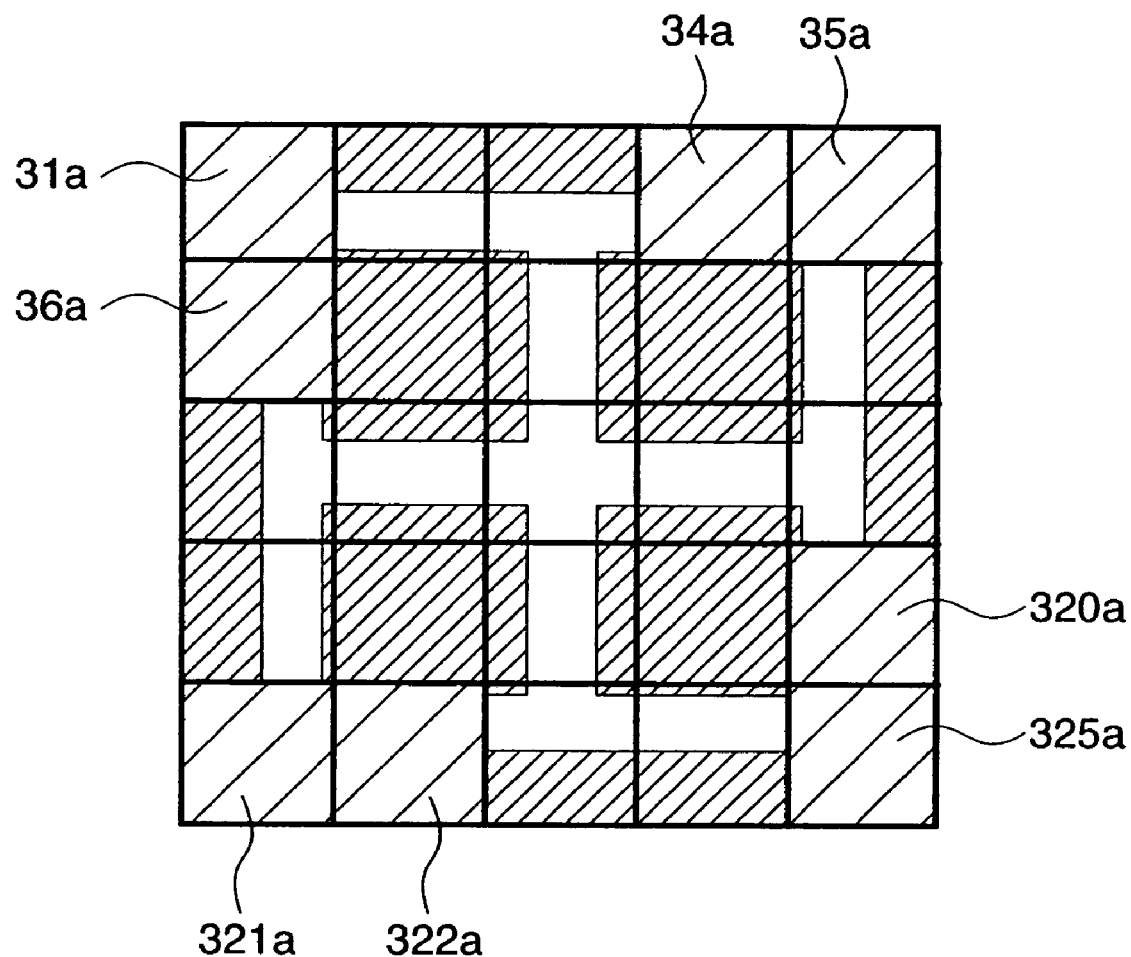
FIG. 3 is a view showing a partial image containing defects.

Effects obtained when divided portion patterns are used in the processes of the flowchart in FIG. 14 will be explained with reference to FIG. 3. FIG. 3 shows a partial image containing defects. The image processor 72 calculates the similarity for each of twenty-five divided regions.

Figure 4:
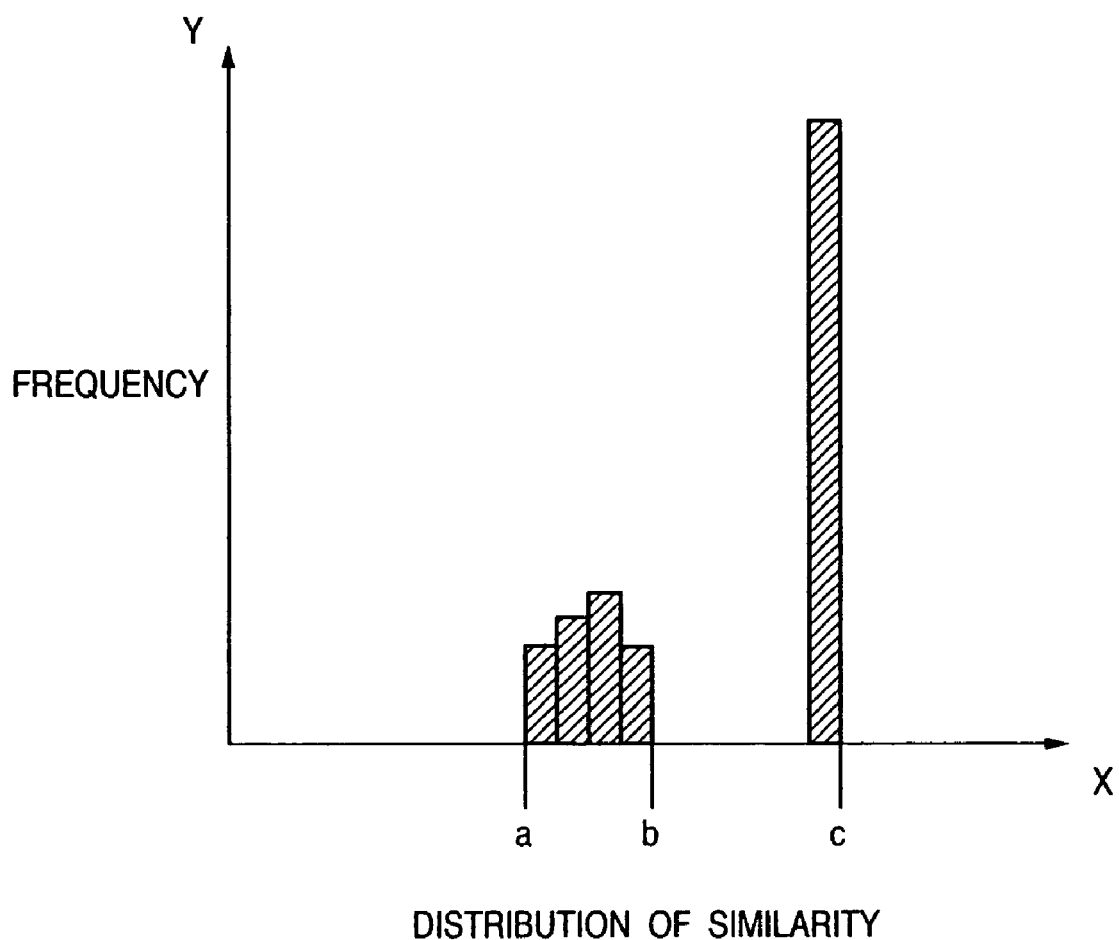
FIG. 4 is a graph illustrating a histogram in which the similarities of divided portion patterns are used as samples.

The similarities of regions, except for regions 31a, 34a, 35a, 36a, 320a, 321a, 322a, and 325a in FIG. 3, are 1.0 (indicating complete coincidence), because they have not degraded. The similarities of the eight regions 31a, 34a, 35a, 36a, 320a, 321a, 322a, and 325a are less than 1.0, because they have degraded. In this embodiment, the similarities range from 0.3 to 0.6. FIG. 4 shows a histogram, which the image processor 72 obtains on the basis of the similarities of the partial regions. The X-axis in FIG. 4 indicates similarity, while the Y-axis indicates frequency. Point a indicates a similarity of 0.3; point b, a similarity of 0.6; and point c, a similarity of 1.0. In the case of FIG. 3, the total number of samples is twenty-five, seventeen samples out of the twenty-five samples have a similarity of 1.0, and eight samples have a similarity of 0.3 to 0.6. Accordingly, if a median is used as an estimate, the estimate is 1.0.

Figure 5:
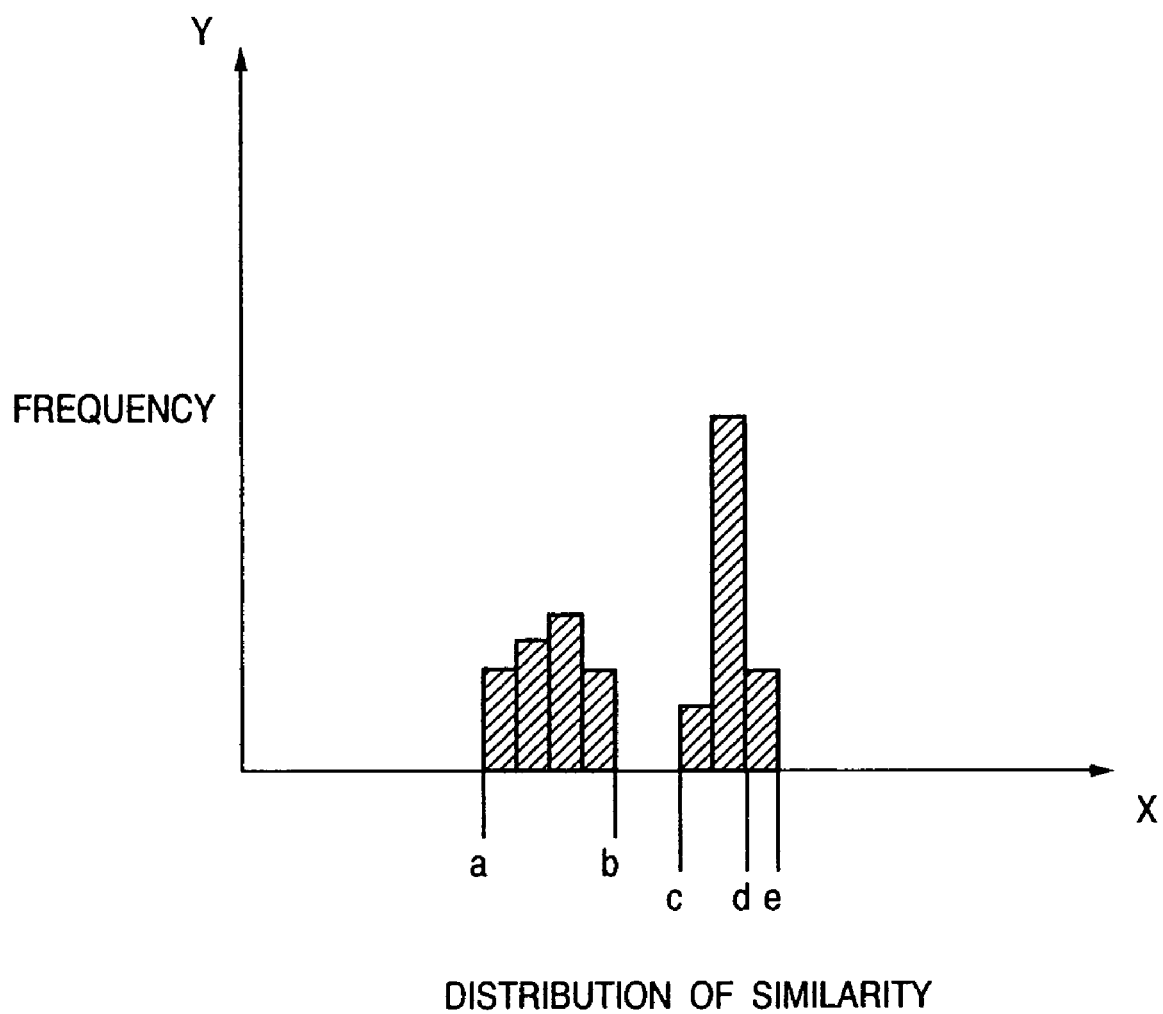
FIG. 5 is a graph illustrating a histogram in which the similarities of divided portion patterns are used as samples.

Assume that regions, except for the regions 31a, 34a, 35a, 36a, 320a, 321a, 322a, and 325a, have somewhat degraded, and have a similarity of 0.8 to 1.0. In this case, a histogram as shown in FIG. 5 is obtained. Point a indicates a similarity of 0.3; point b, a similarity of 0.6; point c, a similarity of 0.8; point d, a similarity of 0.9; and point e, a similarity of 1.0. In this case, if a median is used as an estimate, the estimate of a similarity is 0.9. Even if a partial image contains a defective portion and has suffered local degradation, statistically processing the similarity of a plurality of partial regions makes it possible to prevent a decrease in similarity between a mark portion in an observed image (partial image) and a mark portion in a template image in contrast with good alignment of the mark portions.

Next, an example will be explained wherein evaluation of similarity using divided portion patterns is applied to a partial image not containing a mark. For the sake of simplicity, an explanation will be given by taking, as examples, data of feature quantity vectors A and B below.

Assume the feature quantity vector A of a reference pattern to be recognized and the feature quantity vector B of an observed unknown pattern as follows:

A=[1, 0, 1, 1, 0, 1, 1, 0, 1, 1, 0, 1, 1, 0, 1]; and
B=[0, 1, 0, 1, 0, 1, 1, 1, 0, 0, 1, 1, 1, 0, 1].

In contrast with a data array with fifteen elements indicating the feature quantity vector A, the feature quantity vector B contains irregularly arranged pieces of data. According to a conventional method, the similarity of the feature quantity vector B of the unknown pattern becomes zero.

On the other hand, in this embodiment, the feature quantity vector A is divided into sets of three pieces of data as divided portion patterns. More specifically, the data array with fifteen elements is divided into five sets, i.e., [1, 0, 1], [1, 0, 1], [1, 0, 1], [1, 0, 1] and [1, 0, 1]. In this case, the similarities between the fives pieces of data of the divided portion patterns and the corresponding pieces of data of the unknown pattern, i.e., [0, 1, 0], [1, 0, 1], [1, 1, 0], [0, 1, 1], and [1, 0, 1] are 0, 1.0, 0.5, 0.5, and 1.0, respectively. The median of the similarities is calculated to be 0.5.

With the above-described process, even if a feature quantity vector is partially different from a reference pattern, statistically processing similarities calculated using portion patterns and estimating the similarity make it possible to prevent a decrease in similarity.

[When Selection Portion Patterns are Used]

Figure 6A:
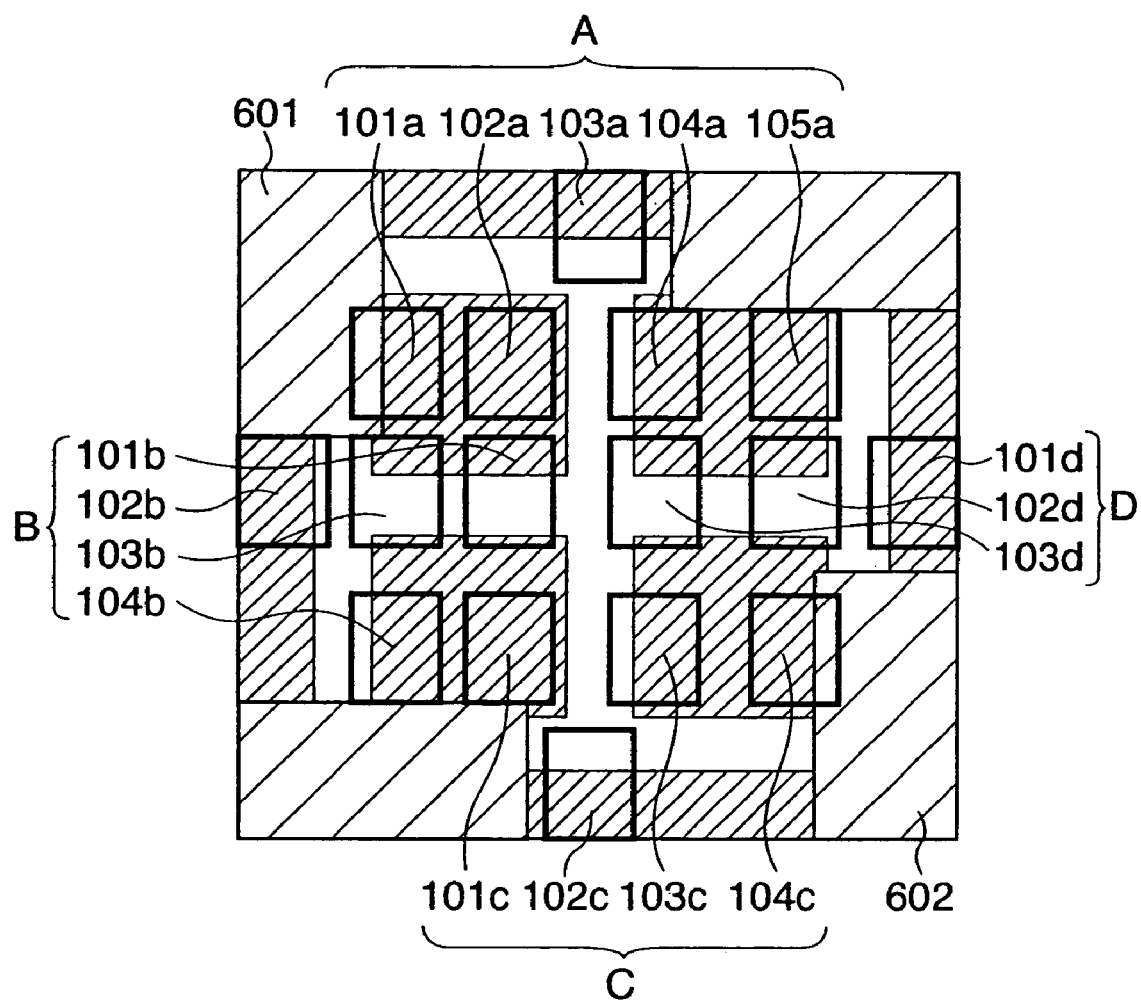
FIG. 6A is a view showing examples of the selected regions of selected portion patterns.

Next, effects, obtained when selected portion patterns are used in the processes of the flowchart in FIG. 14, will be explained with reference to FIG. 6A. FIG. 6A shows a partial image containing defects. The image processor 72 sets a set of pixel regions (A, B, C, and D) so as to correspond to FIG. 1B. The selected portion pattern A is composed of the five selected regions (101a to 105a), and the selected portions B and C are composed of the four selected regions (101b to 104b and 101c to 104c), respectively. The selected portion pattern D is composed of the three selected regions (101d to 103d). A partial region similarity is calculated for each of the selected regions.

Since the regions 102a, 103a, 104a, and 105a in the selected portion pattern A are the same as those in the corresponding selected portion pattern in FIG. 1B, the similarity becomes 1.0 (indicating complete coincidence). The region 101a overlaps a defective region 601. If the similarity of the region 101a is 0.7, the image processor 72 sets the average of the similarities of the regions, i.e., 0.94 as the similarity of the selected portion pattern A.

In the selected portion pattern B, all of the selected regions 101b to 104b are unaffected by defective regions, and are the same as those in the corresponding selected portion pattern in FIG. 1B. Accordingly, the image processor 72 sets the similarity of the selected portion pattern B in FIG. 6A to 1.0. Since the regions 101c, 102c, and 103c in the selected portion pattern C are the same as those in the corresponding selected portion pattern in FIG. 1B, the image processor 72 sets the similarity to 1.0. The region 104c overlaps a defective region 602. If the similarity of the region 104c is 0.68, the image processor 72 sets the average of the similarities of the regions, i.e., 0.92, as the similarity of the selected portion pattern C. In the selected portion pattern D, all of the selected regions 101d to 103d are unaffected by the defective regions, and are the same as those in the corresponding selected portion pattern in FIG. 1B. Accordingly, the image processor 72 sets the similarity of the selected portion pattern D in FIG. 6A to 1.0. The data of the set of similarities of the selected portion patterns are stored in the storage device 1301. In this embodiment, the similarities between the selected portion patterns A, B, C, and D in FIG. 6A, and those in FIG. 1B, are 0.94, 1.0, 0.92, and 1.0, respectively. The image processor 72 sets a median of 0.97 as an estimate of similarity.

With the above described process, even if an observed image contains a defective portion, and has suffered local degradation, statistically processing the similarities of a plurality of partial regions makes it possible to prevent a decrease in similarity between a mark portion in the observed image (partial image) and a mark portion in a template image in contrast with good alignment of the mark portions.

Next, an example will be explained wherein evaluation of similarity using selected portion patterns is applied to a partial image not containing a mark. For the sake of simplicity, an explanation will be given by taking, as examples, data of feature quantity vectors C and D below.

Assume that the feature quantity of vector C of a reference pattern to be recognized and the feature quantity vector D of an observed unknown pattern as follows:

C=[1, 0, 1, 1, 0, 1, 1, 0, 1, 1, 0, 1, 1, 0, 1, 1]; and
D=[0, 1, 0, 1, 0, 1, 1, 1, 0, 0, 1, 1, 1, 0, 1, 1].

In contrast with a data array with sixteen elements indicating the feature quantity vector C, the feature quantity vector D contains irregularly arranged pieces of data. According to a conventional method, the similarity of the feature quantity vector D of the unknown pattern becomes zero.

On the other hand, in this embodiment, the feature quantity vector C is divided into a set of five pieces of data, a set of four pieces of data, a set of four pieces of data, and a set of three pieces of data as selected portion patterns. More specifically, the feature quantity vector is divided into [1, 0, 1, 1, 0], [1, 1, 0, 1], [1, 0, 1, 1], and [0, 1, 1]. In this case, the similarities of the four selected portion patterns are −0.16, −0.33, −0.33, and 1.0, respectively. The median of the similarities is calculated to be −0.25.

With the above-described process, even if a feature quantity vector is partially different from a reference pattern, statistically processing similarities based on a plurality of divided portion patterns and estimating the similarity make it possible to prevent a decrease in similarity.

According to the preferred embodiment of the present invention, an image processing technique can be provided with suppressed misrecognition of an object region in an object image.

Second Embodiment

The details and effects of a position detection process to be performed by an image processor 72 in the second embodiment will be explained more specifically. In the method according to the first embodiment, the feature quantity vector of each partial region is obtained with reference to a template image, thereby obtaining the similarity of the partial region. In a method according to the second embodiment, a feature region is selected from a template image, and a feature quantity vector is obtained for the selected region. The similarity between the obtained feature quantity vector and that of a corresponding region of a partial image in an observed image is calculated, and the similarity between the template image and the partial image is estimated from the calculated similarity.

Figure 16:
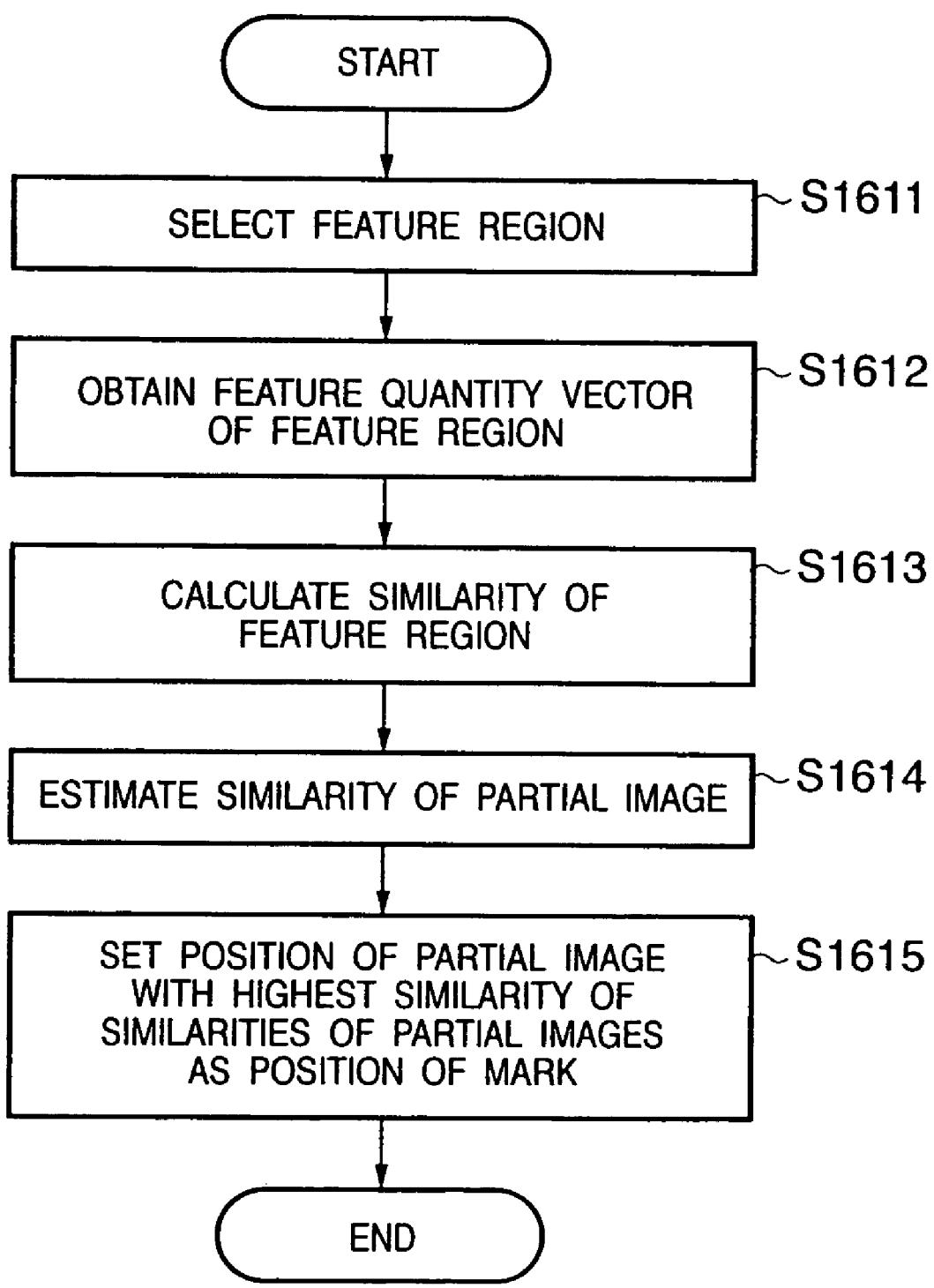
FIG. 16 is a flowchart for schematically explaining the flow of a position detection process.

FIG. 16 is a flowchart for schematically explaining the flow of the position detection process.

First, in step S1611, a feature region is selected from a template image. The template image is divided into a plurality of regions, and discrete Fourier transformation (discrete Fourier transform), discrete cosine transform, or discrete wavelet transformation (wavelet transform) is performed for each of the regions, thereby calculating the power spectrum. On the basis of the calculation result, a region whose spectrum has high values over a specific frequency range is selected, and set as a feature region. The specific frequency range is one with a high proportion of frequency components resulting from an edge extending in the longitudinal direction, or a high proportion of frequency components resulting from an edge extending in the lateral direction.

Figure 2A:
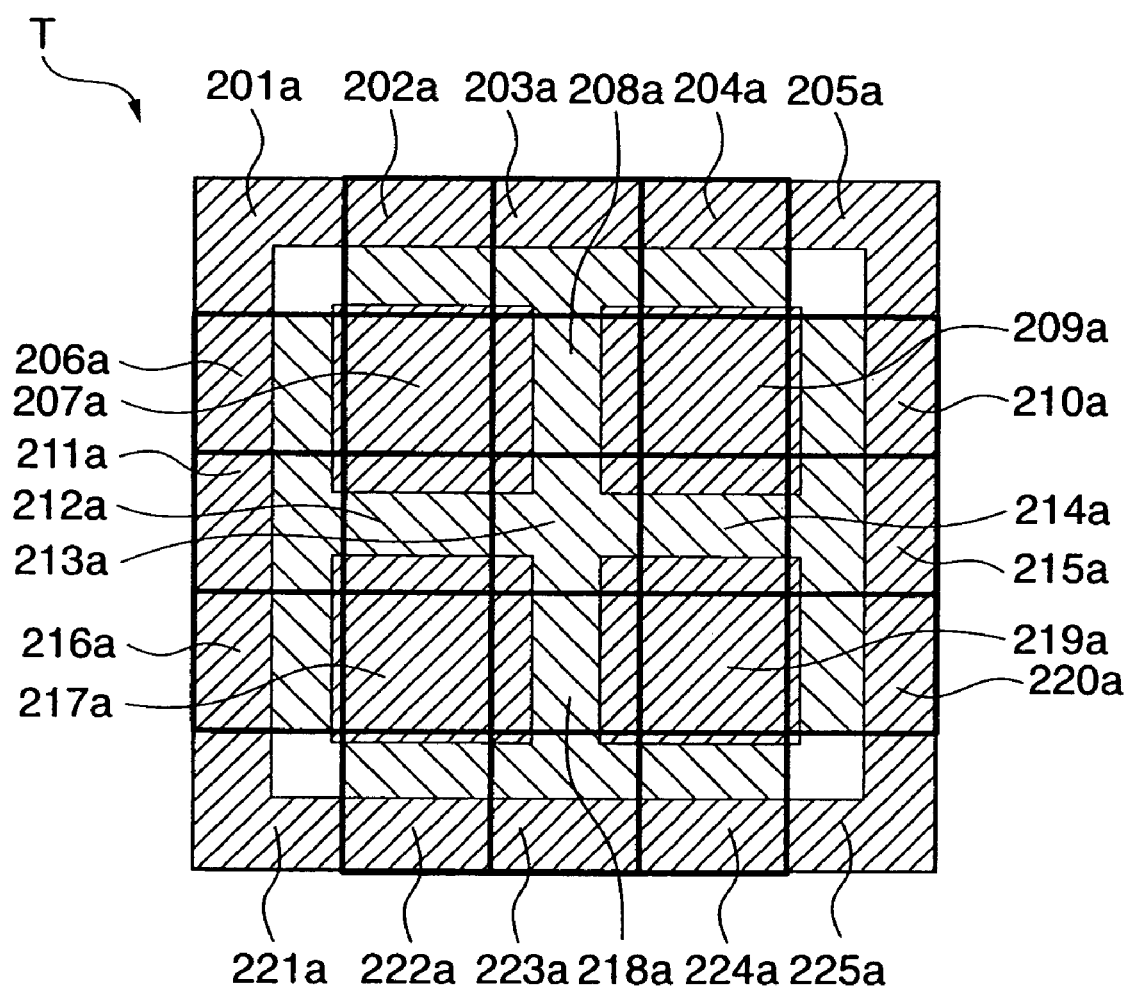
FIG. 2A is a view showing an example wherein a partial image is one of a mark.

FIG. 2A is a view showing an example wherein a partial image is one of a mark. In the process in step S1611, the image processor 72 first divides an image T into twenty-five square regions. In this example, solid black regions 207a, 209a, 217a, and 219a, whose power spectra are composed of only DC components, are disqualified as candidates for selected regions. Since regions 201a, 205a, 221a, and 225a have no features specific to longitudinal components and lateral components of a mark portion, they are disqualified as the candidates for the selected regions. The image processor 72 selects, as feature regions, the remaining regions, in each of which either a longitudinal component or a lateral component becomes dominant. The regions selected as the feature regions are seventeen regions, i.e., regions 202a to 204a, 206a, 208a, 210a to 216a, 218a, 220a, and 222a to 224a.

Figure 2B:
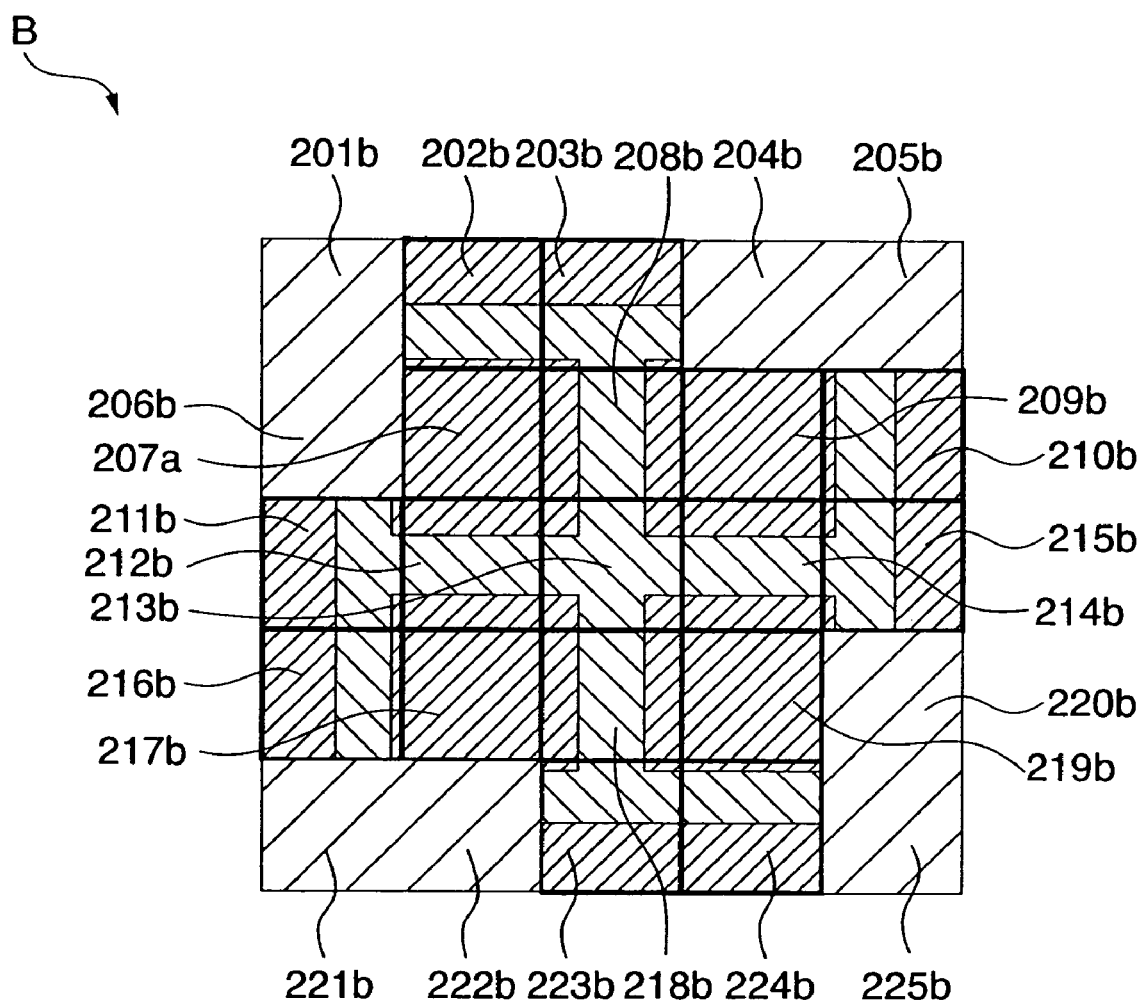
FIG. 2B is a view showing an example of a partial image.

FIG. 2B is a view showing an example of a partial image. Similar to the case of FIG. 24, the image processor 72 divides an image B into twenty-five regions and disqualifies, as candidates for selected regions, solid black regions 207b, 209b, 217b, and 219b out of the divided regions whose power spectra are composed of only DC components. The image processor 72 also disqualifies, as the candidates for the selected regions in an observed image, regions 201b, 204b, 205b, 206b, 220b, 221b, 222b, and 225b, in each of which a feature of a mark is lost due to, e.g., the influence of lightness, because the power spectra of the regions are composed of only DC components. The image processor 72 selects, as feature regions, regions 202b, 203b, 208b, 210b to 216b, 218b, 223b, and 224b, out of the divided regions, in each of which either a frequency component resulting from an edge extending in the longitudinal direction or a frequency component resulting from an edge extending in the lateral direction becomes dominant.

Next, the flow advances to step S1612. Feature quantities are calculated and vectorized for each of the selected regions (for example, in the case of FIG. 2A, the seventeen regions 202a, to 204a, 206a, 208a, 210a to 216a, 218a, 220a, 222a to 2224a) to obtain a portion pattern. Similarly, a feature quantity vector is obtained for each of the feature regions in the partial image.

As explained in the first embodiment, the pixel value of each pixel or edge information can be used as a feature quantity. If a pixel value is used as a feature quantity, the image processor 72 sets the pixel value of each pixel as an element of a feature quantity vector while scanning the pixel, as explained with reference to FIG. 12, for each of regions selected as feature regions. The image processor 72 stores the result in a storage device 1301, such that it can be looked up in a statistical process (to be described later) (step S1412).

In step S1613, the image processor 72 calculates the similarity in feature quantity vector between each of the regions selected as the feature regions, from the template image T, and a corresponding one of the regions selected as the feature regions from the partial image. The flow advances to step S1614. The image processor 72 performs the statistical process for the plurality of similarities calculated in step S1613, and estimates the result to be the similarity between the partial image and the template image. In the estimation of the similarity, the image processor 72 creates a histogram in which the plurality of similarities are used as samples and calculates, from the histogram, an average, a median, the average of the samples, except for the top 25% and bottom 25%, the median of the samples except for the top 25% and bottom 25%, or the like. The image processor 72 sets the value obtained by the statistical process as the similarity. The image processor 72 stores the result of the statistical process in a table in the storage device 1301, which can be looked up.

In this manner, the image processor 72 calculates (estimates) the similarities between partial images and a template image and sets, as the position of a mark, the position of a partial image (the position of a predetermined point, such as the barycentric position of the partial image), with the highest similarity of the calculated similarities. Note that similarity calculation is performed for each of partial images, and all partial regions in an observed image that are equal in size to that of a template image are extracted as partial images.

[Concrete Effects]

Effects obtained by the flowchart in FIG. 16 will be explained more specifically. In FIGS. 2A and 2B, since the regions (202a, 202b), (203a, 203b), (208a, 208b), (210a, 210b), (211a, 211b), (212a, 212b), (213a, 213b), (214a, 214b), (215a, 215b), (216a, 216b), (218a, 218b), (220a, 220b), (223a, 223b), and (224a, 224b), selected as the feature regions, have not suffered any local degradation, the similarities of the regions are 1.0 (indicating complete coincidence).

The image processor 72 creates a histogram whose total number of samples is fourteen for FIGS. 2A and 2B, and estimates the similarity at 1.0 on the basis of the result.

Even if a partial image contains a defective portion, and has suffered local degradation, statistically processing the similarities of a plurality of feature regions makes it possible to prevent a decrease in similarity between a mark portion in the partial image and a mark portion in a template image, in contrast with good alignment of the mark portions.

Next, an example will be explained wherein evaluation of the similarities of feature regions is applied to a partial image not containing a mark. For the sake of simplicity, an explanation will be given by taking, as examples, data of feature quantity vectors E and F below.

Assume the feature quantity vector E of a reference pattern to be recognized and the feature quantity vector F of an observed unknown pattern as follows:

E=[0, 0, 1, 1, 1, 1, 0, 0 0, 0, 0, 0, 0, 0, 0, 0 0, 0, 1, 1, 1, 1, 0, 0 0, 0, 0, 0, 0, 0, 0, 0]; and F=[0, 0, 1, 1, 0, 0, 1, 1, 0, 0, 1, 1, 0, 0, 1, 1, 0, 0, 1, 1, 0, 0, 1, 1, 0, 0, 0, 0, 0, 0, 0, 0].

In contrast with a data array with thirty-two elements indicating the feature quantity vector E, the feature quantity vector F contains irregularly arranged pieces of data. According to a conventional method, the similarity of the feature quantity vector F of the unknown pattern becomes 0.15.

On the other hand, in this embodiment, the image processor 72 divides the feature quantity vector F into sets of eight pieces of data as four portion patterns, i.e., [0, 0, 1, 1, 0, 0, 1, 1], [0, 0, 1, 1, 0, 0, 1, 1], [0, 0, 1, 1, 0, 0, 1, 1], and [0, 0, 0, 0, 0, 0, 0, 0]. The image processor 72 selects one with a feature from the four portion patterns. For example, consider a case wherein portion patterns containing data of 0 and data of 1 are from the feature quantity vector F, the first portion pattern [0, 0, 1, 1, 0, 0, 1, 1], the second portion pattern [0, 0, 1, 1, 0, 0, 1, 1], and the third portion pattern [0, 0, 1, 1, 0, 0, 1, 1]. The image processor also selects, from the feature quantity vector E of a corresponding template image, the first portion pattern [0, 0, 1, 1, 1, 1, 0, 0], the second portion pattern [0, 0, 0, 0, 0, 0, 0, 0], and third portion pattern [0, 0, 1, 1, 1, 1, 0, 0]. Using normalization correlation of formula (1), the similarities between the selected portions are calculated to be 0, 0, and 0, respectively. The median of the similarities is calculated to be 0.

With the above-described process, even if one of two feature quantity vectors is based on a degraded image, extracting pieces of partial data serving as features from part of each quantity vector and statistically processing the similarities calculated on the basis of the pieces of the partial data makes it possible to obtain a more appropriate similarity.

According to the preferred embodiment of the present invention, there can be provided an image processing technique with suppressed misrecognition of an object region in an object image.

Third Embodiment

The details of a position detection process to be performed by an image processor 72 in the third embodiment will be explained. In this embodiment, selection of feature regions and acquisition of information on the feature vectors of the selected regions explained in the second embodiment are performed for each of a plurality of mark images. The image processor 72 averages the obtained information on the plurality of mark images to obtain a template image.

Figure 17:
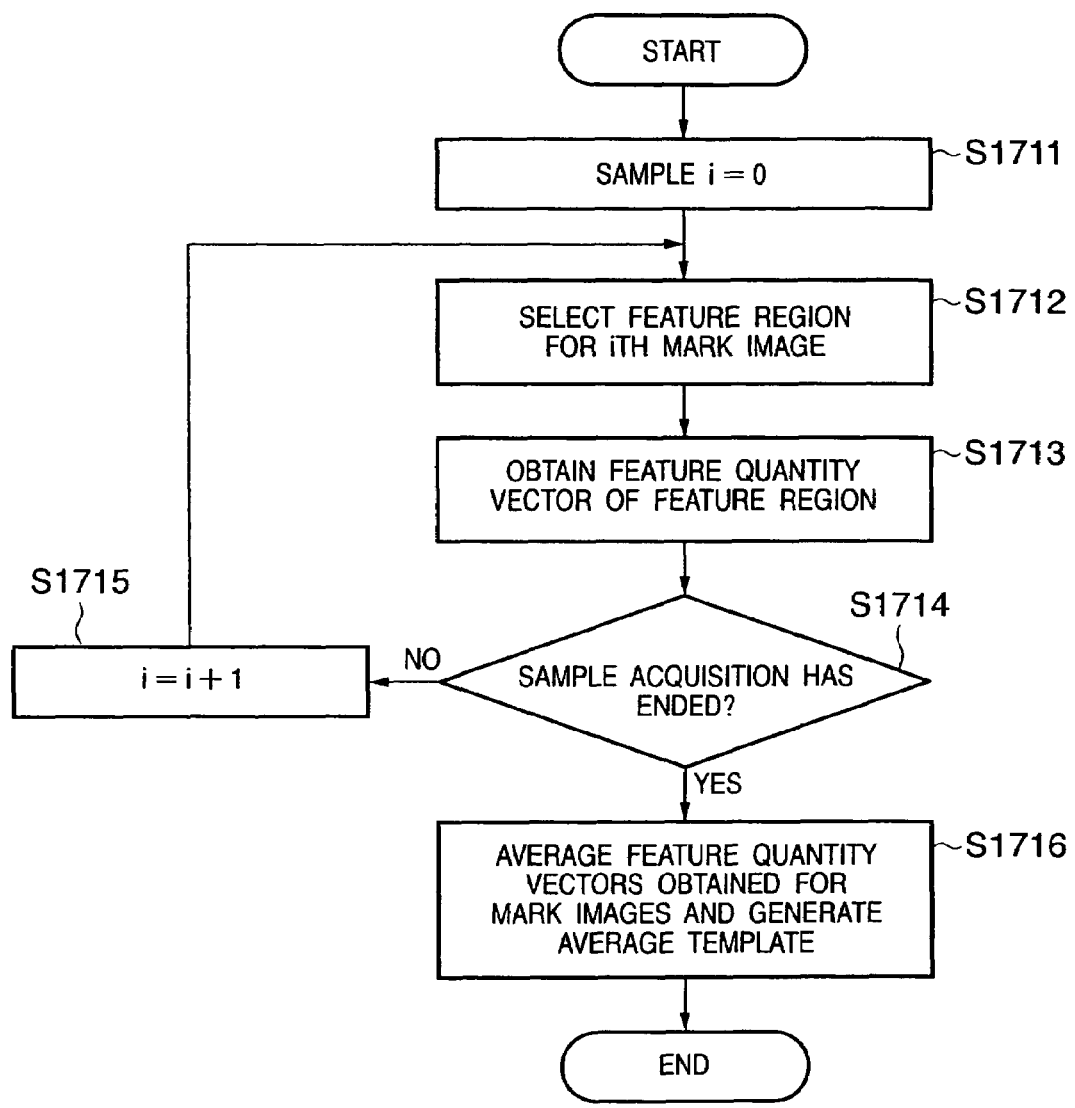
FIG. 17 is a flowchart for schematically explaining the flow of a position detection process according to the third embodiment.

FIG. 17 is a flowchart for schematically explaining the flow of the position detection process according to the third embodiment. In step S1711, a counter for counting the number of mark images containing an alignment mark is initialized. The flow advances to step S1712. The image processor 72 selects feature regions for the ith mark image. The image processor 72 divides the ith mark image into a plurality of regions, and performs discrete Fourier transformation, discrete cosine transform, or discrete wavelet transformation for each of the regions, thereby calculating the power spectrum. On the basis of the calculation result, a region whose spectrum has high values over a specific frequency range is selected and set as a feature region. The feature region selection process is the same as the process in step S1611 explained in the second embodiment, and thus, a detailed explanation thereof will be omitted.

In step S1713, the feature quantity vectors of the feature regions selected in step 1712 are obtained. As explained in the first and second embodiments, the pixel value of each pixel or edge information can be used as a feature quantity. If a pixel value is used as a feature quantity, the image processor 72 sets the pixel value of each pixel as an element of a feature quantity vector (a1, a2, . . . , am1), while scanning the pixel, as explained with reference to FIG. 12, for each of the regions selected as the feature regions (in the case of mark No. 1 in FIG. 18, 1, 2, . . . , m1). The image processor 72 stores the result in a storage device 1301, such that it can be looked up in order to create a template obtained by averaging the result (see FIG. 18).

In step S1714, the image processor 72 determines whether the acquisition of samples has ended. If the acquisition has not ended (NO in step S1714), the flow advances to step S1715 to increment the counter (i). The flow returns to step S1712 to repeat the same process.

On the other hand, if the image processor 72 determines that the acquisition of samples has ended (YES in step S1714), the flow advances to step S1716. The image processor 72 statistically processes the feature quantity vectors obtained for mark images and creates an averaged template image, (also to be simply referred to as a template image). The statistical process for obtaining the template image may use an average or may include obtaining a median or a composite component calculated using singular value decomposition.

FIG. 18 is a chart showing a state wherein the selected regions of a plurality of mark images, the feature quantity vectors for the selected regions, and an averaged template image based on the obtained feature quantity vectors, are stored in the storage device 1301.

Figure 6B:
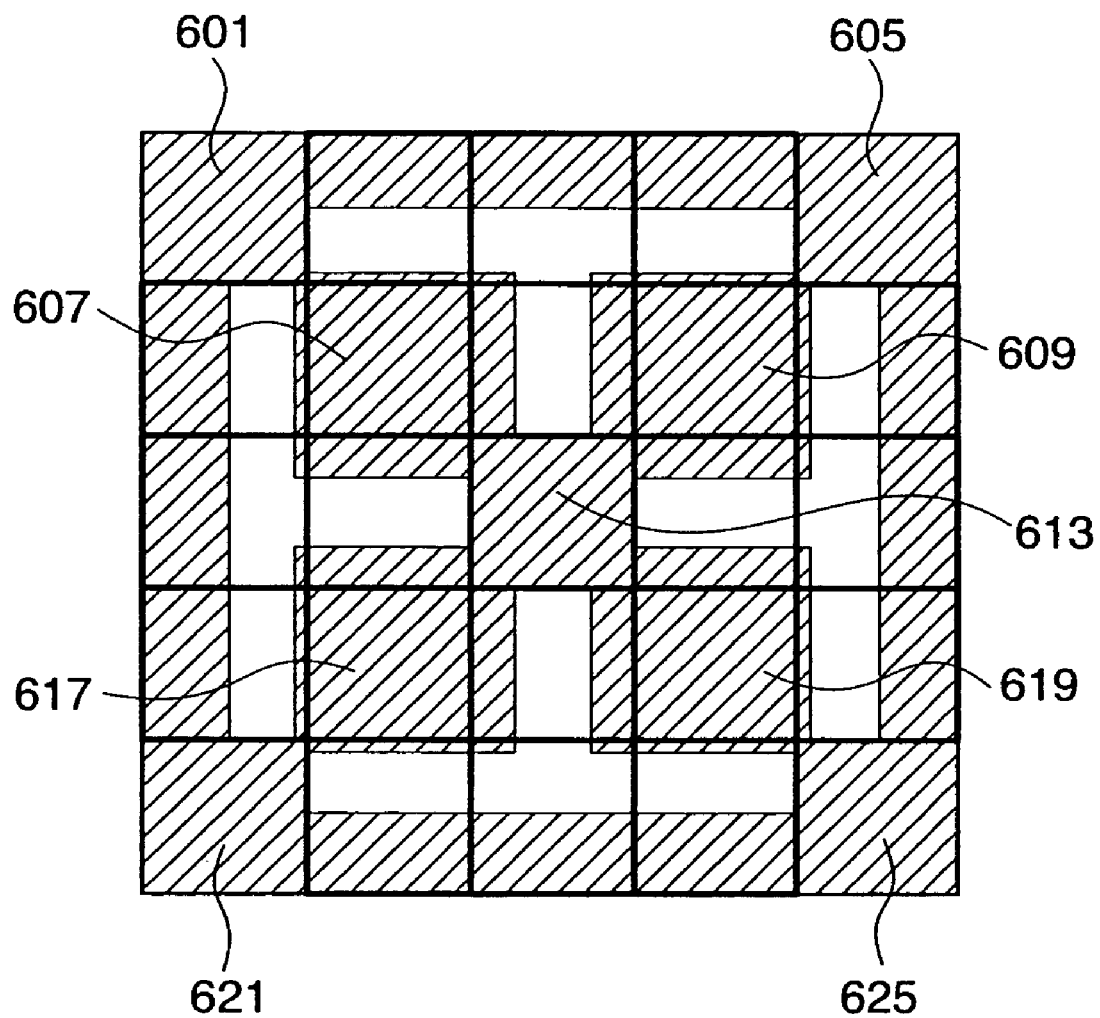
FIG. 6B is a view showing an example of a template image obtained from the feature quantity vectors of a plurality of mark images.

FIG. 6B is a view showing an example of a template image obtained from the feature quantity vectors of a plurality of mark images according to the third embodiment. For example, regions 601, 605, 607, 609, 613, 617, 619, 621, and 625 are ones which are not selected as feature regions, and are likely to suffer local degradation due to a change in lightness or a defect. For this reason, the image processor 72 generates a template image for regions except for the regions 601, 605, 607, 609, 613, 617, 619, 621, and 625.

Figure 19:
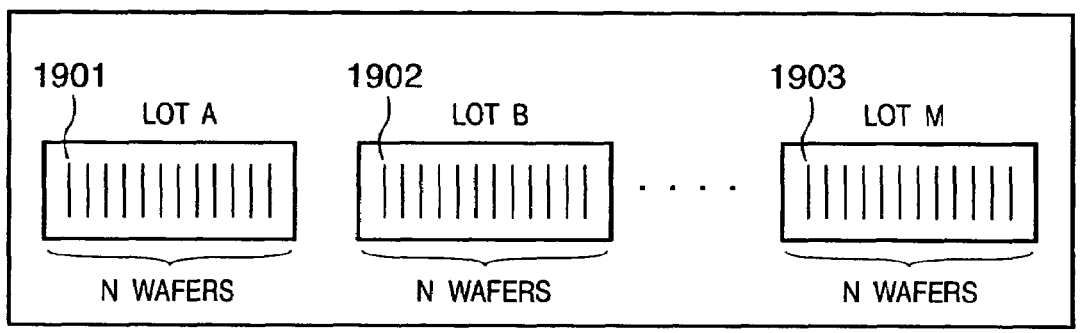
FIG. 19 is a view showing lost A, B, . . . , M, each composed of N wafers to be exposed in a semiconductor exposure apparatus.

FIG. 19 is a view showing lots A, B, . . . , M, each composed of N wafers to be exposed by a semiconductor exposure apparatus. As for application of the first to third embodiments, for example, wafers 1901, 1902, and 1903, each of which is at the head of a corresponding lot, or N wafers of the first lot A, may be used as samples to generate an averaged template image, and the result may be applied to the succeeding wafers.

The first to third embodiments described above makes it possible to obtain the similarity between a template image and an observed image at high precision and to improve the precision in detecting the position of a mark. According to the preferred embodiments of the present invention, there can be provided an image processing technique with suppressed misrecognition of an object region in an object image. In addition, the embodiments decrease a rate at which a semiconductor manufacturing apparatus stops due to a failure in mark detection of the apparatus, and allow an increase in operating efficiency and productivity.

Fourth Embodiment

Figure 7:
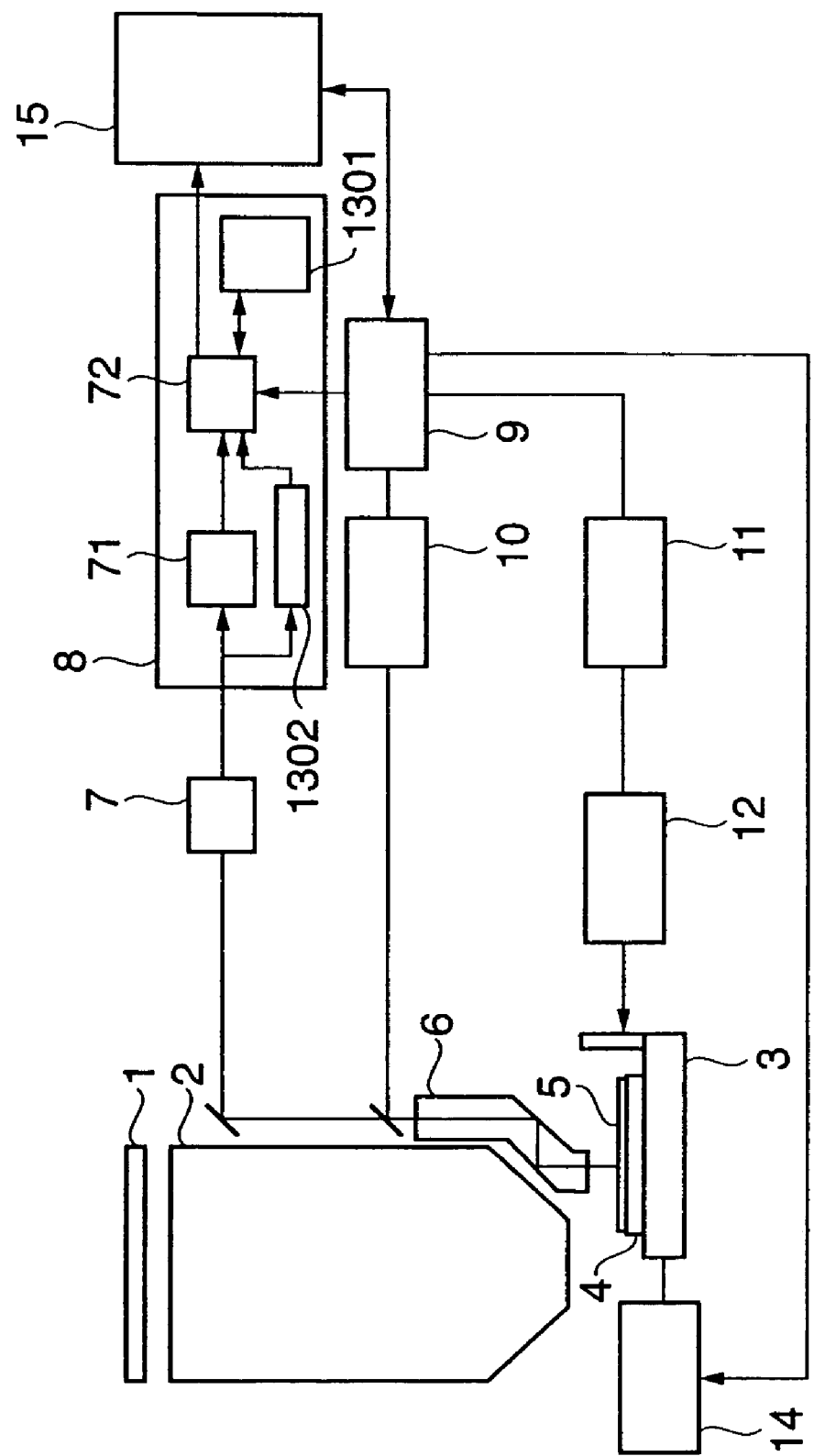
FIG. 7 is a view showing the schematic arrangement of a semiconductor exposure apparatus.

An embodiment that pertains to a semiconductor exposure apparatus using the above-described pre-alignment will be explained next. FIG. 7 is a view showing the schematic arrangement of the semiconductor exposure apparatus. This embodiment is applied to pre-alignment detection by an off-axis scope 6.

A pattern serving as a master to be exposed is formed on a reticle 1. The reticle is illuminated by an illumination system (not shown) with i-line or excimer laser light, and the pattern of the reticle is projected onto a wafer 5 by a projection lens 2.

Pre-alignment is performed after a wafer transport apparatus (not shown) loads the wafer 5 onto a wafer suction chuck 4 on an X-Y stage 3. Since the wafer 5 is aligned on the wafer suction chuck 4 in accordance with the mechanical precision of the transport apparatus, it is impossible in terms of precision to directly shift to precision position measurement of the wafer. For this reason, a detection mark for pre-alignment measurement (pre-alignment mark) on the wafer is observed by the off-axis scope 6 outside the projection lens 2, an image pickup unit 7, such as a CCD camera, performs photoelectric conversion, and then, a pre-alignment image processing apparatus 8 detects an observed image of the alignment mark and its vicinity.

Inside the pre-alignment image processing apparatus 8, an A/D conversion device 71 converts a video signal obtained by the photoelectric conversion into digital information. The image processor 72 reads out data, or the like, on a template image of the alignment mark stored in the storage device 1301, and parameters for performing the pre-alignment process, and detects the position of the pre-alignment mark.

The position where the X-Y stage 3 is located, when an observed image of the pre-alignment mark and its vicinity is captured, is accurately measured by a laser interferometer 12, and the positional information of the stage having been processed by a detection processing circuit 11 is input to a control device 9. The image observed by the off-axis scope 6 is processed by a detection processing circuit 10, and is then input to the control device 9. The control device 9 accurately calculates a shift amount of the wafer 5 on the wafer suction chuck 4 from a positional shift of the pre-alignment mark, and the position of the X-Y stage 3, and inputs the shift amount to a stage drive control device 14. The stage drive control device 14 aligns the X-Y stage 3 so as to reduce the shift amount fed back from the control device 9 to 0.

In FIG. 7, reference numeral 15 denotes a second image processing apparatus, which performs a process of detecting the precise position of the alignment mark after coarse wafer alignment performed in the above-described manner. The control device 9 generates alignment information of the X-Y stage 3, on the basis of the final position of the alignment mark obtained by the second image processing apparatus. In accordance with the alignment information, the stage drive control device 14 drives the X-Y stage 3 and performs a final alignment.

In this embodiment, dark-field illumination is used for illumination in the off-axis scope 6. In the case of dark-field illumination, scattered light from an edge position of the mark, where there is a difference in level, is received by the CCD camera 7, or the like. However, the present invention is not limited to dark-field illumination. The present invention can also be applied to an observed image obtained by photography under bright-field illumination.

The schematic processing flow of the pre-alignment process, in the pre-alignment image processing apparatus 8 and semiconductor exposure apparatus using the pre-alignment image processing apparatus, will be explained with reference to the flowchart in FIG. 8. First, the image processor 72 calculates divided portion patterns of a mark image under the procedure below.

In step S800, the image processor 72 reads, from the storage device 1301, a template image (mark image) of an alignment mark, which is registered in advance.

In step S801, the image processor 72 sets the mark image as an image Img.

In step S802, the image processor 72 reads parameters required to calculate divided portion patterns (parameters that pertain to the coordinate values of divided regions, a feature quantity type, and feature quantity vectorization) from the storage device 1301.

The image processor 72 divides the template image into divided regions using the parameters read in step S802, obtains the feature quantity vectors of the divided regions, and sets the feature quantity vectors as the divided portion patterns of the image Img (S803). This process corresponds to the process in step S1411 of FIG. 14.

The pattern of a partial image included in an observed image picked up by the image pickup unit 7 is calculated in the procedure below.

First, in step S804, an observed image obtained by the image pickup unit 7, such as a CCD camera, is read into the pre-alignment image processing apparatus 8.

The image processor 72 extracts, from the observed image, a partial image to the size of the template image (step S806). In step S807, the image processor 72 sets the partial image extracted from the observed image as an image Img2.

In step S808, the image processor 72 reads, from the storage device 1301, the parameters (parameters that pertain to the coordinate values, the feature quantity type, and feature quantity vectorization) read in step S802, to obtain the pattern of the partial image.

In step S809, the image processor 72 divides the partial image Img2 into divided regions, so as to correspond to the divided portion patterns, in accordance with the parameters read in step S608. The image processor 72 obtains the feature quantity vectors of the divided regions, and sets the feature quantity vectors as patterns of the partial image Img2.

In step S810, the image processor 72 calculates the similarity of one of the patterns of the partial image Img2 corresponding to each of the divided portion patterns. This process corresponds to the process in step S1412 of FIG. 14.

In step S811, the image processor 72 estimates the similarity of the partial image Img2 using the similarities to the divided portion patterns obtained in step S810. This process corresponds to step S1413 in FIG. 14.

The processes in steps S806 to S811 are repeated until no partial image to be extracted is left in the observed image. If no partial image is left unread (NO in step S805), the flow advances to step S812. The position of a partial image with the highest similarity of the estimated similarities of partial images is set as the position of the mark. This process corresponds to step S1414 in FIG. 14.

Figure 8:
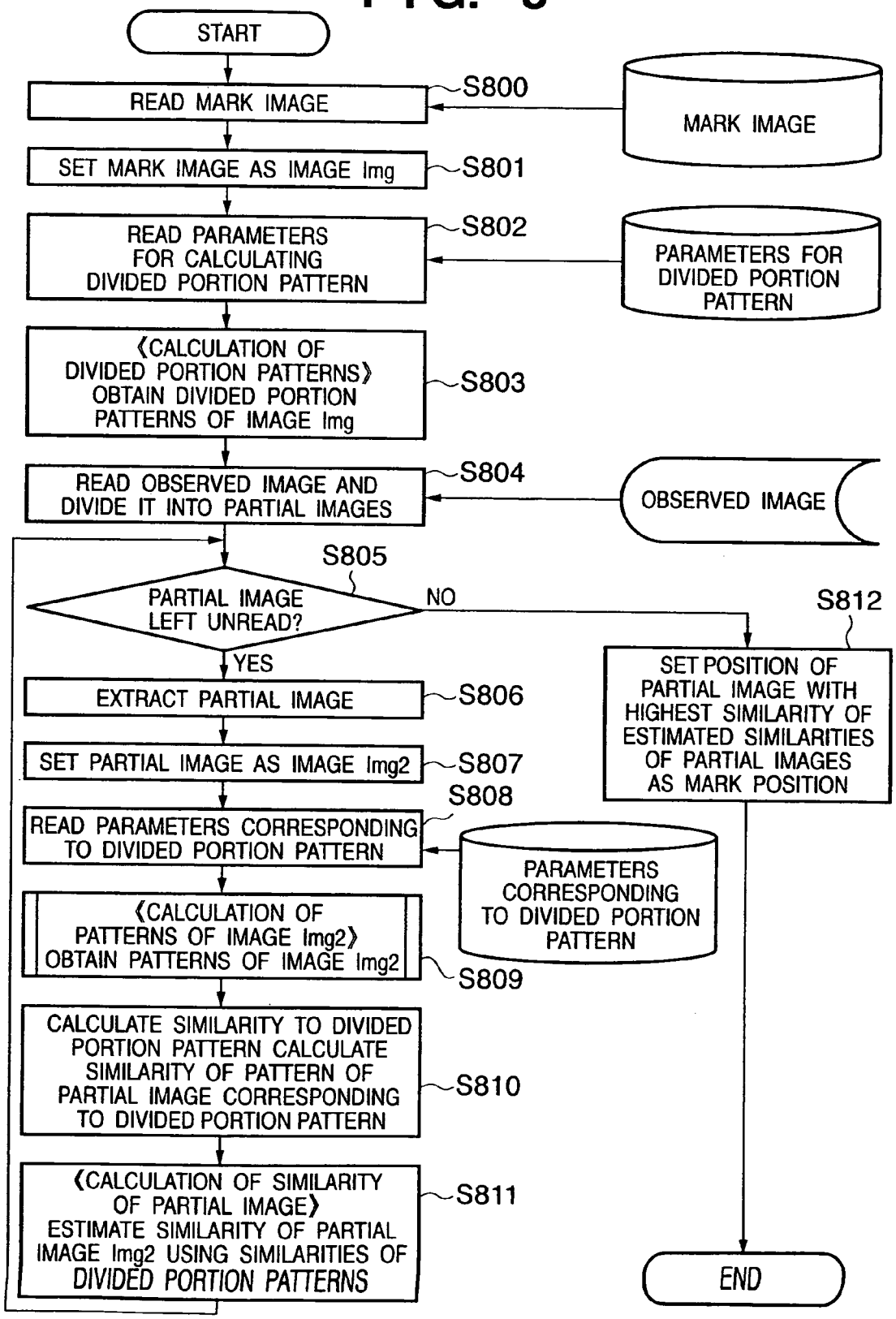
FIG. 8 is a flowchart for explaining the schematic processing flow of a pre-alignment process in a pre-alignment image processing apparatus 8 and the semiconductor exposure apparatus using the pre-alignment image processing apparatus.
Figure 9:
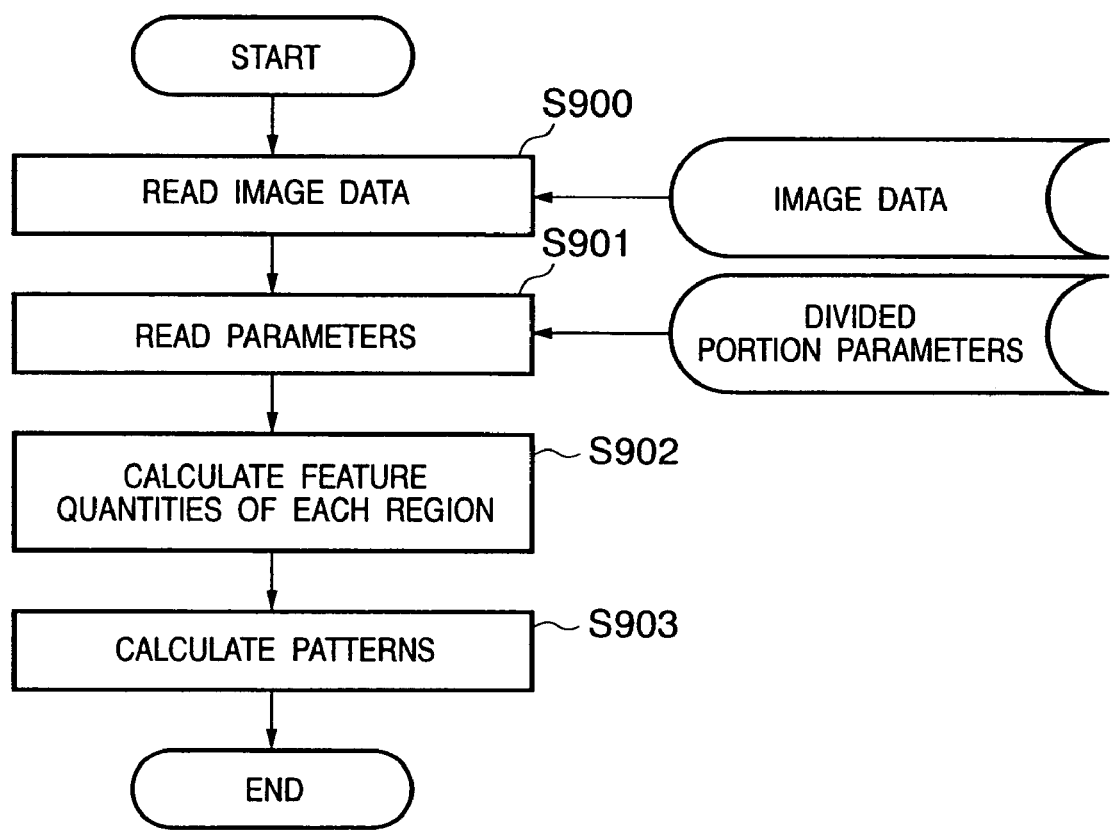
FIG. 9 is a flowchart for specifically explaining a method of calculating divided portion patterns in step S803 of FIG. 8, and calculating patterns of a partial image Img2 in step S809.

A method of calculating the divided portion patterns in step S803 of FIG. 8 and a method of calculating the patterns of the partial image Img2 in step S809 will then be explained more specifically with reference to FIG. 9.

First, in step S900, the image processor 72 reads image data for which a pattern is to be calculated and sets the image data as the image Img or image Img2.

Next, in step S901, the image processor 72 reads parameters (divided portion parameters) describing the coordinate values of divided regions (as for the division state, see FIG. 1A), a feature quantity type, and the order of feature quantity vectorization (e.g., the definition of the scanning direction for setting pixel values as shown in FIG. 12) in each of the divided regions required to calculate patterns for (vectorize) the image Img or image Img2. The coordinates of neighboring pixels close to the regions can be used as the coordinate values of the regions.

In step S902, the image processor 72 obtains the feature quantities of each of partial regions into which the image Img or image Img2 is divided using the divided portion parameters read in step S901. In step S903, the image processor 72 vectorizes the feature quantities of each of the partial regions calculated in step S902 using the vectorization order information of the divided portion parameters read in step S901, thereby calculating a pattern.

Figure 10:
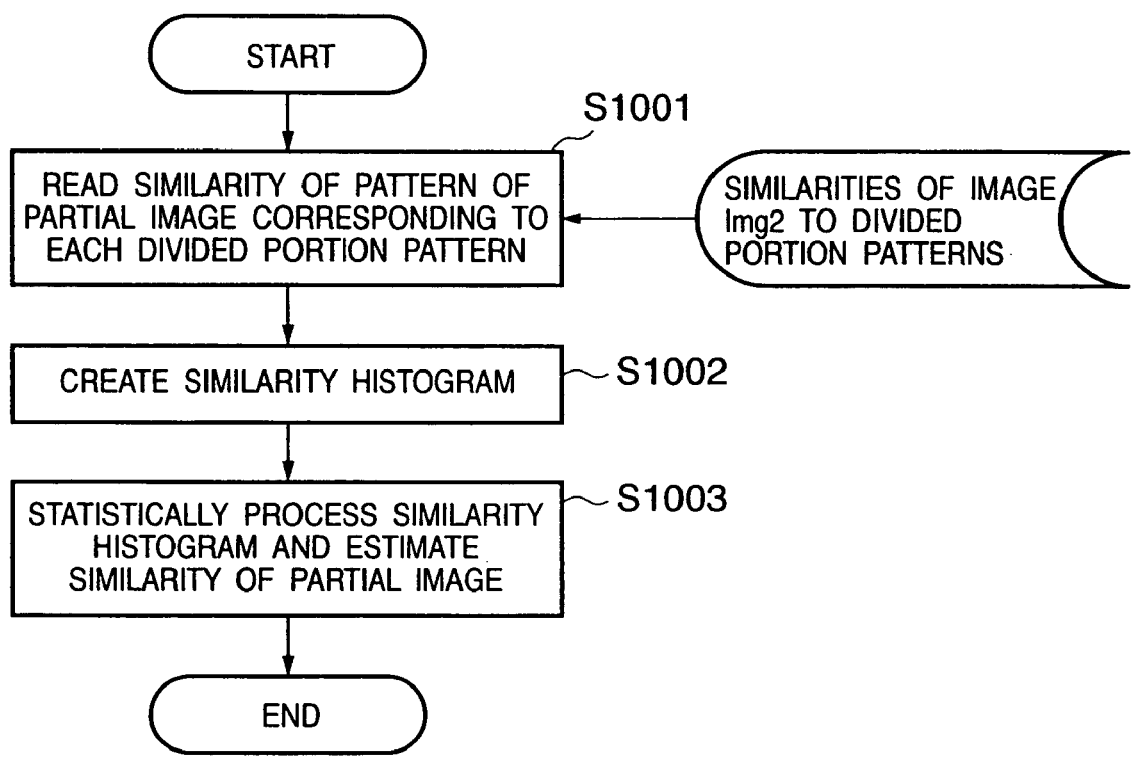
FIG. 10 is a flowchart for explaining the flow of a process of estimating the similarity of the partial image Img2 in step S811 of FIG. 8.
Figure 11A:
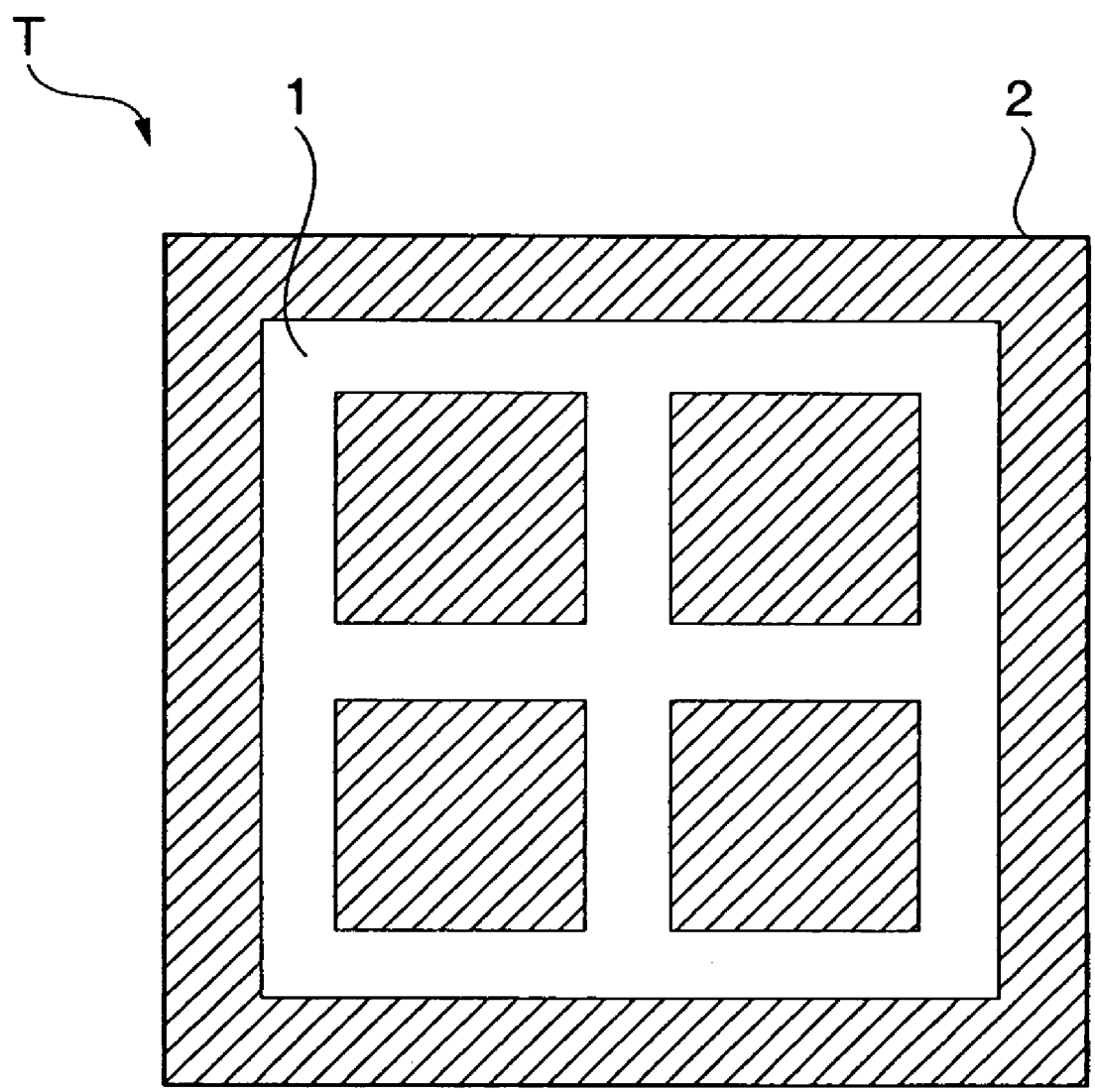
FIG. 11A is a view showing a template image T to be recognized.
Figure 11B:
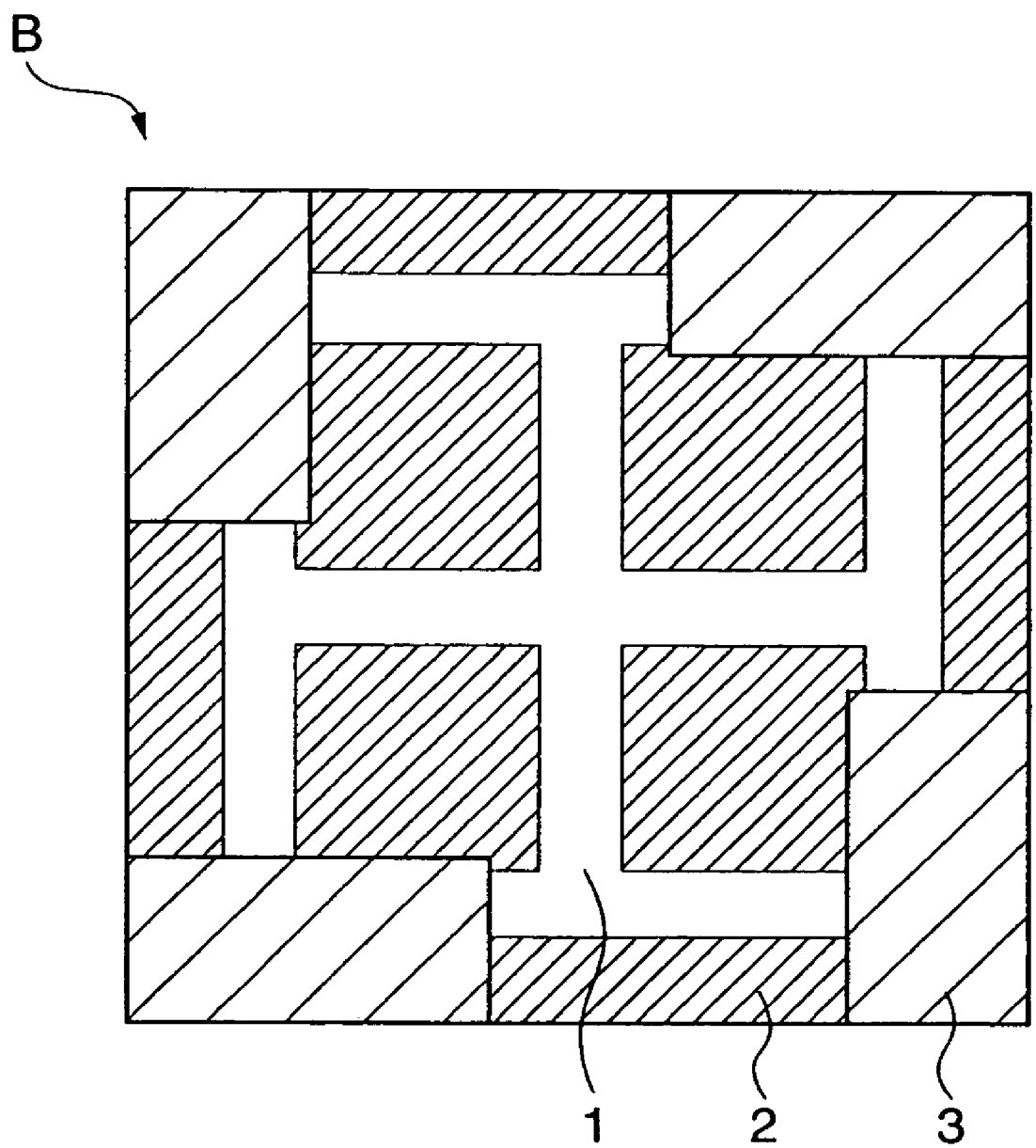
FIG. 11B is a view showing an image B whose lightness has changed in four corners.
Figure 11C:
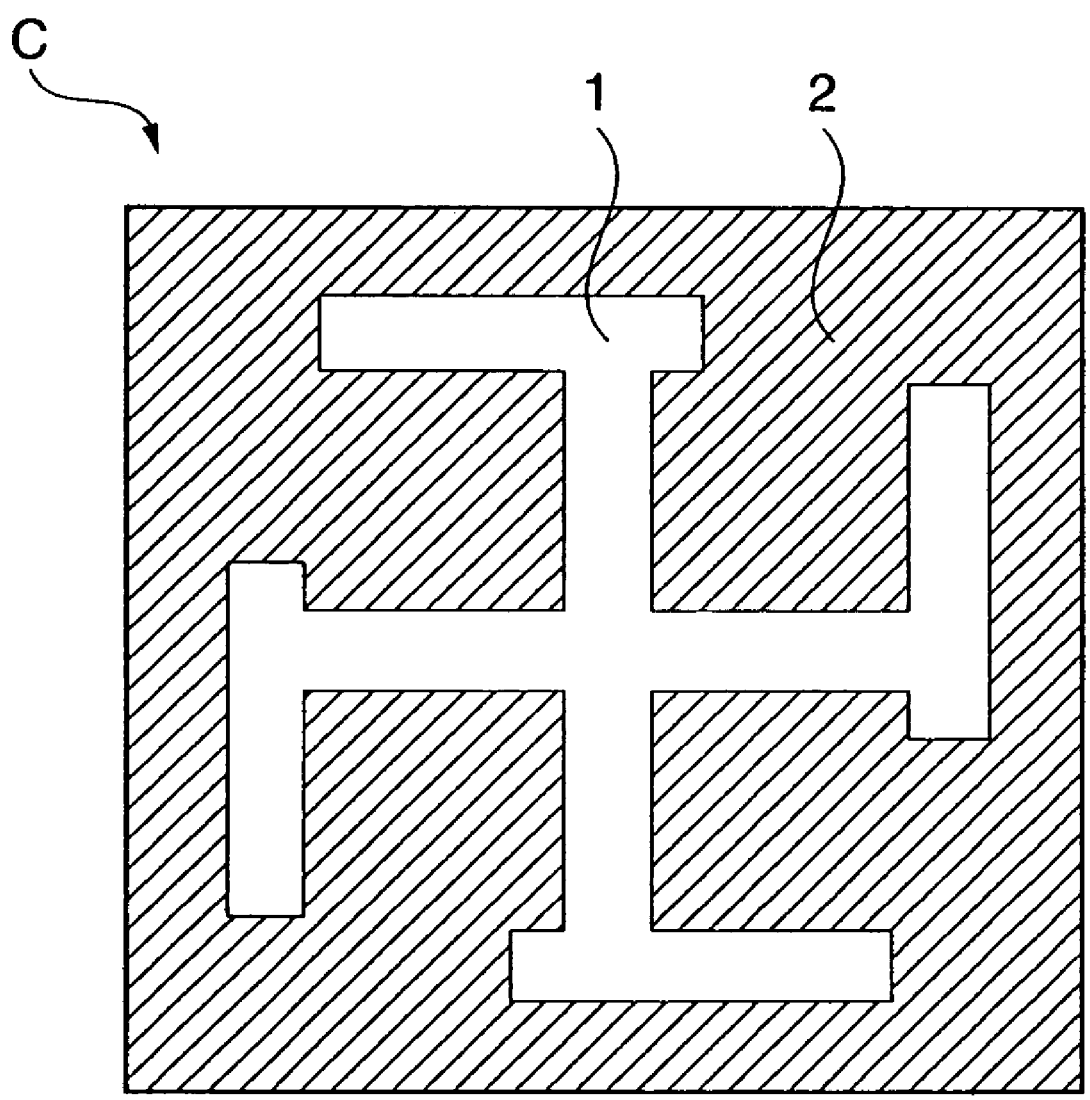
FIG. 11C is a view showing an example of an image C whose four corners are lost.

Next, the flow of a process of estimating the similarity of the partial image Img2 in step S811 of FIG. 8 will be explained with reference to FIG. 10. First, in step S1001, the image processor 72 reads the similarities (corresponding to 1503 in FIG. 15) of the partial regions of the partial image (image Img2) corresponding to the divided portion patterns calculated in step S810 of FIG. 8.

Next, the image processor 72 creates a histogram, in which the similarities of the partial regions read in step S1001 are used as samples (S1002).

In step S1003, the image processor 72 statistically processes the histogram created in step S1002 and estimates the similarity of the partial image Img2 (the obtained estimate for the partial image Img2 corresponds to 1504 in FIG. 15). Note that, as the statistical process, the image processor 72 estimates the similarity of the partial image by calculating a statistic, such as an average, a median, the average of the samples, except for the top 25% and bottom 25%, or the median of the samples, except the top 25% and bottom 25%.

As described above, in the pre-alignment process in the semiconductor exposure apparatus, even if a feature quantity vector in a partial image is partially different from a reference pattern, the semiconductor exposure apparatus according to this embodiment statistically processes the similarities of a plurality of partial regions, thereby estimating the similarity of the partial image. This operation suppresses misrecognition of a mark position and implements an excellent pre-alignment process.

According to this embodiment, it is possible to prevent the apparatus from stopping due to mark misrecognition, and to provide a semiconductor exposure apparatus with a high degree of availability.

Fifth Embodiment

The fourth embodiment has explained an example of a semiconductor exposure apparatus which performs a pre-alignment process by statistically processing the similarity of each partial image by using divided portion patterns. The similarity of each partial image may be evaluated using selected portion patterns (see, e.g., FIG. 1B), instead of divided portion patterns.

In this case, it is advisable to estimate the similarity of a partial image Img2 to a mark image Img by the following operation. More specifically, parameters (parameters that pertain to the coordinate values of divided regions, a feature quantity type, and the feature quantity vectorization), required to calculate selected portion patterns for a mark image read in step S800 of FIG. 8, are read from a storage device 1301, and selected portion patterns are obtained for the image Img. As for each partial image in an observed image, selected portion patterns are obtained for the partial image Img2 using the same parameters.

In the pre-alignment process in the semiconductor exposure apparatus of the fourth embodiment, the similarity of the partial image Img2 to the mark image Img2 may be estimated by performing discrete Fourier transformation, discrete cosine transformation, or discrete wavelet transformation for each of the regions, to calculate the power spectrum, as explained with reference to FIG. 17, determining feature regions of the mark image and partial image, instead of obtaining divided portion patterns, and calculating the feature quantities of each of the feature regions.

As described above, even if a feature quantity vector is partially different from a reference pattern, a semiconductor exposure apparatus according to this embodiment statistically processes the similarities of a plurality of partial regions, thereby estimating the similarity of the partial image. This operation implements a pre-alignment process with suppressed mark position misrecognition.

Assume that, in obtaining selected portion patterns, feature regions of a mark image and a partial image are extracted on the basis of power spectra, the feature quantities of each region are calculated, and an averaged template image is obtained. In this case, since a portion which is susceptible to local degradation can be disqualified in advance as a candidate for an object for similarity evaluation, mark position misrecognition can be further suppressed.

This embodiment makes it possible to prevent an apparatus from stopping due to mark misrecognition and to provide a semiconductor exposure apparatus with a high degree of availability.

There can be provided an image processing technique with suppressed misrecognition of an object region in an object image.

Embodiment of Device Manufacturing Method

Figure 20:
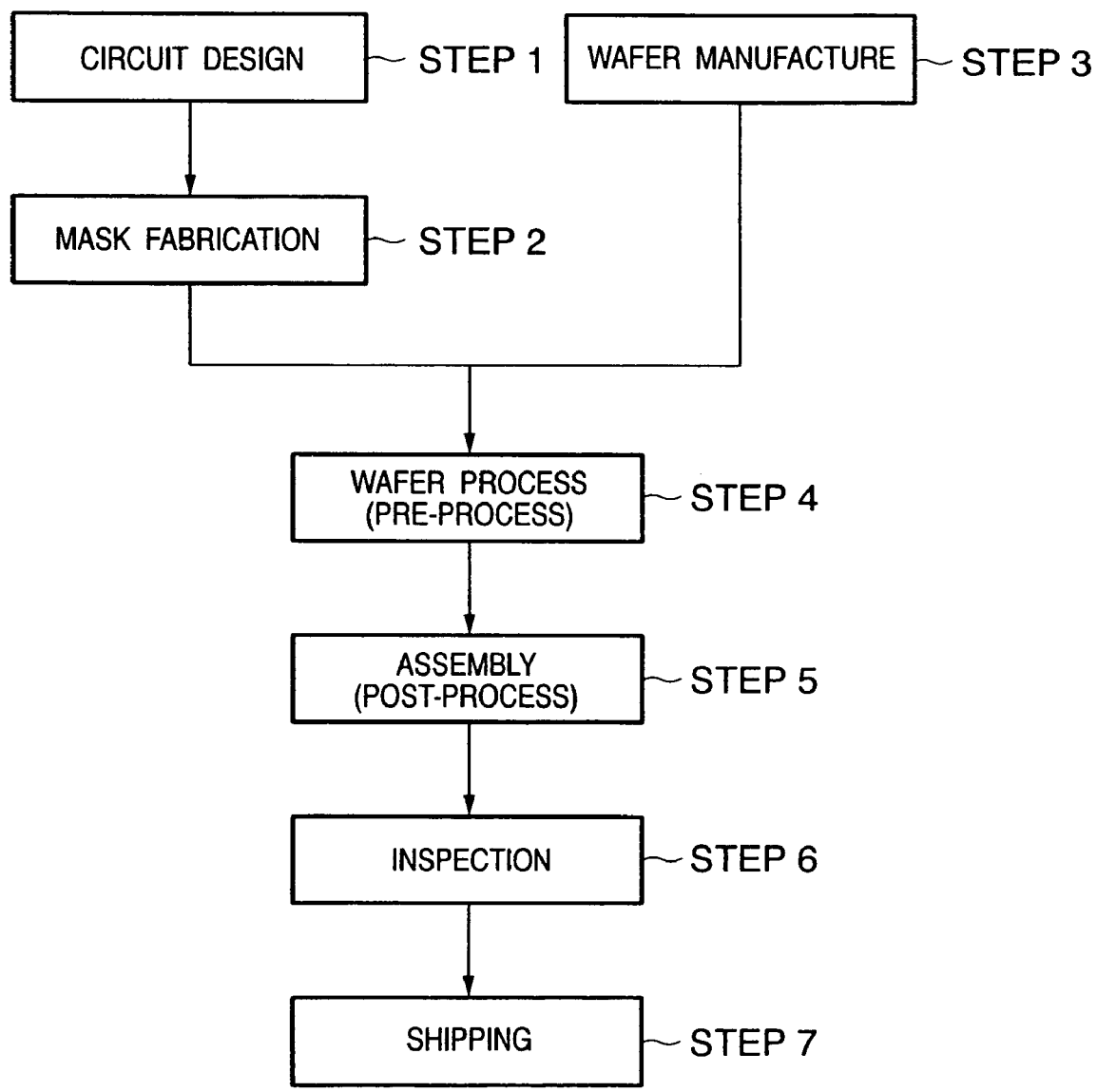
FIG. 20 is a flowchart showing the flow of the entire manufacturing process of a semiconductor device.

A manufacturing process for a device, such as a semiconductor device using an exposure apparatus, such as a semiconductor exposure apparatus, will be explained. FIG. 20 shows the flow of the entire manufacturing process of manufacturing a semiconductor device. In step 1 (circuit design), the circuit of a semiconductor device is designed. In step 2 (mask formation), a mask bearing the designed circuit pattern is formed. In step 3 (wafer manufacture), a wafer is manufactured using a material such as silicon. In step 4 (wafer process), which is called a pre-process, an actual circuit is formed on the wafer by lithography, using the prepared mask and wafer. The next step, step 5 (assembling), is called a post-process, and is a step of forming a semiconductor chip using the wafer fabricated in step 4. This step includes assembling steps, such as an assembling step (dicing and bonding) and a packing step (chip encapsulation). In step 6 (inspection), the semiconductor device fabricated in step 5 undergoes inspections, such as an operation verification test and a durability test. After these steps, the semiconductor device is completed and shipped (step 7).

Figure 21:
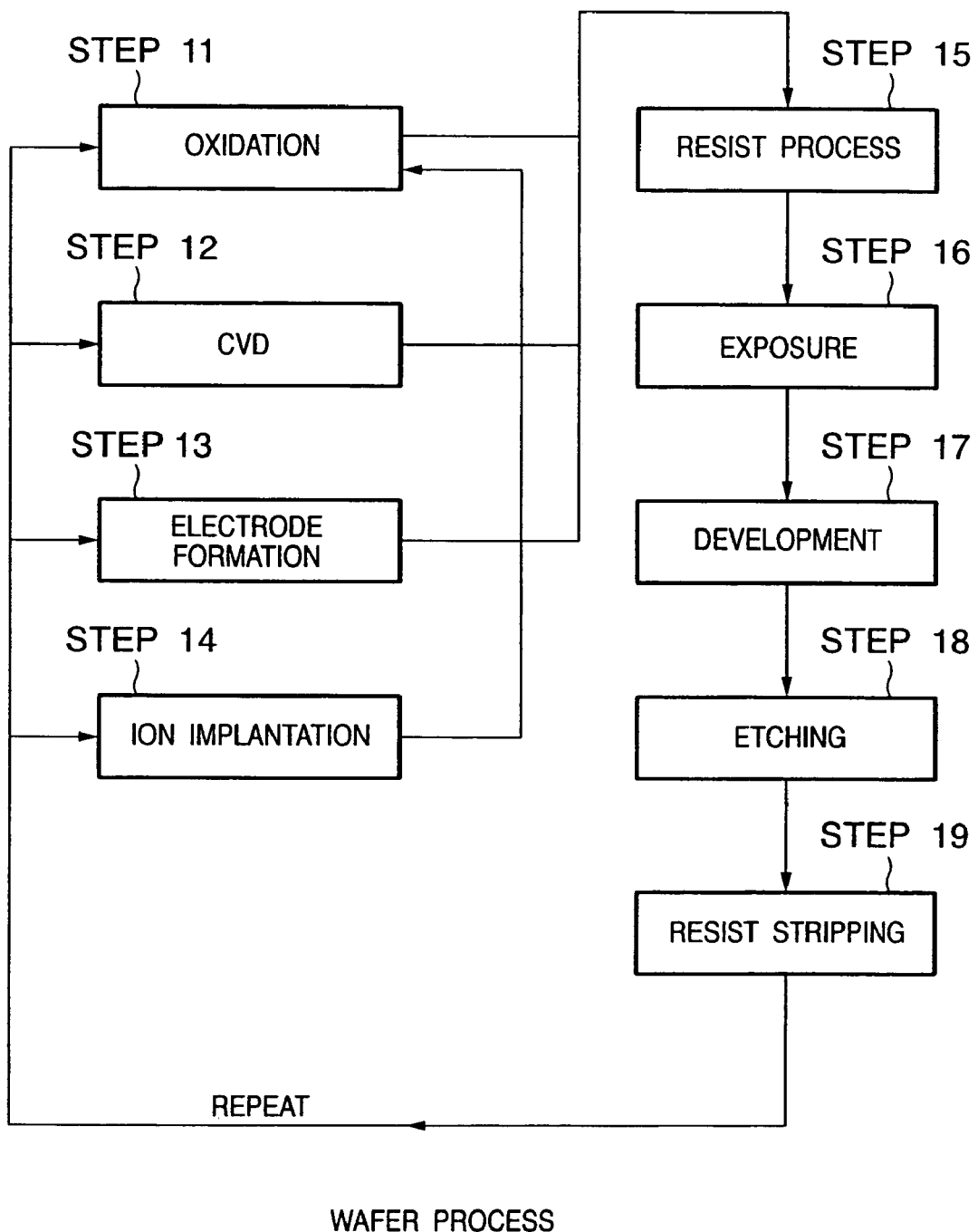
FIG. 21 is a flowchart showing the detailed flow of the wafer process in FIG. 20.

FIG. 21 shows the detailed flow of the wafer process. In step 11 (oxidation), the surface of the wafer is oxidized. In step 12 (CVD), an insulation film is formed on the surface of the wafer. In step 13 (electrode formation), an electrode is formed on the wafer by vapor deposition. In step 14 (ion implantation), ions are implanted into the wafer. In step 15 (resist process), a photosensitive agent is applied to the wafer. In step 16 (exposure), the circuit pattern is drawn on the wafer (the wafer is exposed to the circuit pattern) using the above-described exposure apparatus. In step 17 (development), the exposed wafer is developed. In step 18 (etching), the resist is etched, except for the developed resist image. In step 19 (resist stripping), the unnecessary resist, after the etching, is stripped. These steps are repeated, thereby forming multiple circuit patterns on the wafer.

According to the device manufacturing method of this embodiment, an exposure apparatus with suppressed misrecognition of a mark position is provided. Thus, the productivity of devices can be made higher than by using a conventional method.

What is claimed is:

1. An apparatus comprising:
   (a) an image processor configured (i) to calculate a similarity between first image data of a first partial region in object image data and reference image data, with respect to each pair of a second partial region of the first image data and a third partial region of the reference image data that correspond to each other, (ii) to calculate a statistic of a plurality of the calculated similarities, with respect to a plurality of the image pairs, and (iii) to recognize, as a position of an object region in the object image data, a position of the first partial region in the object image data, which has the highest statistic of a plurality of the calculated statistics; and
   (b) an exposure unit configured to expose a substrate to a pattern based on the position of the object region recognized by said image processor.

2. An apparatus according to claim 1, wherein said image processor is configured to extract the first partial regions in the object image data.

3. An apparatus according to claim 1, wherein said image processor is configured to determine each pair.

4. An apparatus according to claim 3, wherein said image processor is configured to determine each pair by obtaining spatial frequency components of each of partial regions of at least one of the first image data and the reference image data.

5. An apparatus according to claim 1, wherein said image processor is configured to obtain the similarity by calculating a correlation between the first image data and the reference image data with respect to each pair.

6. An apparatus according to claim 1, wherein the statistic is one of an average of the plurality of similarities, a median of the plurality of similarities, and a value calculated from a histogram of the plurality of similarities.

7. A method comprising:
   executing the following steps by a computer:
   (a) calculating a similarity between first image data of a first partial region in object image data and reference image data with respect to each pair of (i) a second partial region of the first image data and (ii) a third partial region of the reference image data that correspond to each other;
   (b) calculating a statistic of a plurality of similarities calculated in said step of calculating the similarity;
   (c) recognizing, as a position of an object region in the object image data, a position of the first partial region in the object image data which has the highest statistic of a plurality of the statistics calculated in said step of calculating the statistic; and
   (d) exposing a substrate to a pattern based on the position of the object region recognized in said recognizing step.

8. An apparatus according to claim 1, wherein the object is a mark formed on a substrate to be exposed.

9. A method of manufacturing a device, said method comprising steps of:
   exposing a substrate to a pattern using an apparatus as defined in claim 1;
   developing the exposed substrate; and
   processing the developed substrate to manufacture the device.

* * * * *